(12) United States Patent
Nam et al.

(10) Patent No.: US 7,710,477 B2
(45) Date of Patent: May 4, 2010

(54) CMOS IMAGE SENSORS HAVING PIXEL ARRAYS WITH UNIFORM LIGHT SENSITIVITY

(75) Inventors: Jung Hyun Nam, Suwon-Si (KR); Yun Hee Lee, Youngin-Si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 1187 days.

(21) Appl. No.: 11/264,437

(22) Filed: Nov. 1, 2005

(65) Prior Publication Data

US 2006/0132633 A1 Jun. 22, 2006

(51) Int. Cl.
*H04N 5/335* (2006.01)

(52) U.S. Cl. .............. 348/275; 348/281; 348/301; 348/302; 348/308; 257/292; 257/294; 257/354

(58) Field of Classification Search .......... 348/275, 348/281, 292, 294, 300, 301, 302, 307, 308; 257/291, 292, 294, 354
See application file for complete search history.

(56) References Cited

U.S. PATENT DOCUMENTS

| | | | |
|---|---|---|---|
| 4,636,865 A * | 1/1987 | Imai | 348/307 |
| 6,160,281 A | 12/2000 | Guidash | 257/292 |
| 6,172,369 B1 * | 1/2001 | Waechter et al. | 250/370.09 |
| 6,633,334 B1 | 10/2003 | Sakurai et al. | 348/308 |
| 6,930,299 B2 * | 8/2005 | Ohkawa | 250/208.1 |
| 7,026,185 B2 * | 4/2006 | Lee | 438/60 |
| 7,064,362 B2 * | 6/2006 | Roy | 257/225 |
| 7,514,732 B2 * | 4/2009 | Okita et al. | 257/292 |
| 2004/0141077 A1 * | 7/2004 | Ohkawa | 348/308 |
| 2005/0179796 A1 * | 8/2005 | Okita et al. | 348/308 |
| 2005/0237405 A1 * | 10/2005 | Ohkawa | 348/308 |
| 2006/0043440 A1 * | 3/2006 | Hiyama et al. | 257/291 |

FOREIGN PATENT DOCUMENTS

| | | |
|---|---|---|
| JP | 2000124438 | 4/2000 |
| KR | 1999-0084630 | 12/1999 |
| KR | 10-2004-0022169 | 3/2004 |
| KR | 1020040022169 A | 3/2004 |

* cited by examiner

*Primary Examiner*—Lin Ye
*Assistant Examiner*—Chriss S Yoder, III
(74) *Attorney, Agent, or Firm*—F. Chau & Associates, LLC

(57) ABSTRACT

Solid state CMOS active pixel sensor devices having unit pixels that are structured to provide improved uniformity of pixel-to-pixel sensitivity across a pixel array without the need for an additional light shielding layer. For example, unit pixels with symmetrical layout patterns are formed whereby one or more lower-level BEOL metallization layers are designed operate as light shielding layers which are symmetrically patterned and arranged to balance the amount of incident light reaching the photosensitive regions.

23 Claims, 14 Drawing Sheets

CMOS IMAGE SENSORS HAVING PIXEL ARRAYS WITH UNIFORM LIGHT SENSITIVITY

CROSS-REFERENCE TO RELATED APPLICATION

This application claims priority to Korean Patent Application No. 10-2004-0107181, filed on Dec. 16, 2004, which is fully incorporated herein by reference.

TECHNICAL FIELD OF THE INVENTION

The present invention relates generally to CMOS active pixel sensor devices having improved response uniformity and, in particular, methods for fabricating CMOS active pixel sensor devices having pixels structures that provide increased uniformity of pixel-to-pixel sensitivity across a pixel array.

BACKGROUND

Various types of solid state imaging devices/have been developed, which primarily include charge-coupled devices (CCDs) and complementary metal oxide semiconductor (CMOS) image sensor devices, as well as hybrid image sensors that are based on a combination of CCD and CMOS image sensor designs. In general, CCD and CMOS solid state imaging sensors CCD image sensors operate based on the "photoelectric effect", which occurs when silicon is exposed to light. In particular, CCD and CMOS image sensors include pixel arrays where each unit pixel includes a light receiving region including one or more photo detector elements (such as photodiodes) formed in an active silicon region of the pixel. When the light receiving region is exposed to light, photons in the visible and near-IR (infra red) light spectrums have sufficient energy to break covalent bonds in the silicon, thereby releasing electrons from the valence band into the conduction band. The amount of electrons generated is proportional to the light intensity. The photon-generated charges are accumulated by the photo detector elements in the pixel array, and then detected and processed to generate a digital image.

FIG. 1 is a schematic circuit diagram illustrating a unit pixel of a conventional CMOS image sensor device having a 4-transistor (4-T) active pixel sensor framework. In general, the exemplary unit pixel (10) comprises a PD (photo detector) element (or light receiving element), a transfer transistor TX, an FD (floating diffusion) region (or sense node), a reset transistor RX, an amplifier DX (or source follower amplifier), and a select transistor SX. The PD element may be a photodiode or a pinned photodiode, for example, which is formed in a light receiving region (or photosensitive region) of the pixel (10). The PD element is coupled/decoupled to/from the FD region by operation of the transfer transistor TX. The reset transistor RX has a gate electrode connected to an RS control signal line. The transfer transistor TX has a gate electrode connected to a TG control signal line. The select transistor SX has a gate electrode connected to an SEL control signal line and a source electrode connected to an output (column) line OUT. The transistors RX, TX, DX and SX are operated to perform functions such as resetting the pixel, transferring accumulated charges from the PD element to the FD region, and converting the accumulated charges in the FD region to a measurable voltage that is amplified and transferred to the output line OUT.

More specifically, the exemplary unit pixel (10) operates as follows. Initially, during an integration period (or charge collection period), the pixel (10) is illuminated with incident light and photo-generated charges are accumulated in a potential well (or charge accumulation region) of the PD element. After the integration period is complete, the reset transistor RX is activated by a reset control signal applied to the RS control signal line, to drain charge from the FD region and set the FD region to a reference potential (e.g., the FD region is charged to approximately the source voltage VDD less the threshold voltage of the reset transistor RX). After the reset operation, the transfer transistor TX is activated by a control signal applied to the TG control signal line to transfer the accumulated photo-generated charges from the PD element to the FD region. The amplifier transistor DX amplifies the voltage of the FD region and the amplified voltage is buffered/coupled to the column output line (26) via the select transistor SX, which is activated by a row select signal applied to the SEL control signal line.

Historically, analog CCD image sensors have dominated the market for solid-state imaging applications due to various advantages afforded by CCD image sensors, including superior dynamic range, low FPN (fixed pattern noise) and high sensitivity to light. Advances in CMOS technologies, however, have led to the development of improved CMOS image sensor designs, thereby allowing CMOS solid state image sensors to displace CCDs in various solid state imaging applications. Solid state CMOS image sensors afford various advantages including, for example, low cost fabrication, low power consumption with a single voltage power supply, system-on-chip integration, high-speed operation (e.g., capturing sequential images at high frame rates), highly-integrated pixel arrays, on-chip image processing systems, random access to unit pixels, etc. In contrast, CCD image sensor devices are expensive to fabricate, typically require 2, 3 or more supply voltages at different clock speeds with significantly higher power consumption, and do not allow random access to unit pixels.

Compared to solid state CCDs, however, conventional CMOS active pixel sensors have lower "fill factors", which results in degraded performance (e.g., low sensitivity to incident light, low quantum efficiency, poor signal-to-noise ratio and limited dynamic range.). In general, the pixel "fill factor" (or aperture efficiency) refers to the ratio of the area of the light receiving region (or photosensitive region) of the pixel to the total area of the pixel. CMOS active pixel sensors have low "fill factors" due to the incorporation of the active circuits and associated interconnects in the unit pixels surrounding the designed photosensitive regions. The "fill factor" of a CMOS active pixel sensor is further explained with reference to FIG. 2, which schematically illustrates an exemplary layout pattern of a unit pixel (20).

As depicted in FIG. 2, the total surface area of the unit pixel (20) includes a defined photosensitive region (21) and a transistor region (22) that surrounds the photosensitive region (21). The photosensitive region (21) is the area of the pixel that is designed to capture incident light striking the pixel (20). A light receiving element (e.g., photodiode PD) is formed in the active silicon of the photosensitive region (21). The transistor region (22) is the pixel area in which the active components (e.g., amplifier, reset, and row select transistors) and BEOL (Back-End-Of-Line) interconnect structures are formed. For the most part, the transistor region (22) is essentially an "optically dead" region because most of the incident light on the transistor region (22) is absorbed or reflected by the active circuit components and interconnects within the region (22). Consequently, the photosensitive region (21) of the pixel (20), which is capable of absorbing photons to generate charge, is limited by the pixel area needed for the transistor region (22), resulting in a low fill factor. Various pixel designs include L-shaped photodiodes, rectangular shaped photodiodes and square-shaped photodiodes, which provide different "fill factors".

Although the transistor region (22) is, for the most part, an "optically dead" region of the pixel (20), some light incident can be absorbed by the underlying substrate of the transistor region (22) resulting in generation of photo-generated charges. These photo-generated charges can be collected in the potential well of the PD element. In this regard, the "designed" fill factor of the active pixel (which is based on the actual exposed area (aperture) of the photosensitive region (21)) differs from an "effective" fill factor because the transistor region (22) of the pixel can also contribute to charges collected in by the PD element. Moreover, some of the photo-generated charges in the transistor region (22) can be captured by the junctions (e.g., FD region) or potential wells of active components in the transistor region (22), or can diffuse to, and be collected in, PD elements of neighboring pixels. Consequently, the generation of photo charges in the transistor region (22) can result in noise and cause non-uniform pixel response across the pixel array.

In some conventional active pixel designs, pixel response non-uniformity is mitigated by use of a separate metal light shield layer formed over the pixel array, wherein the light shield layer operates to shield incident light from pixel transistor regions, but comprises apertures aligned to the photosensitive regions to allow incident light to reach the photosensitive regions of the pixel. Essentially, the light shield layer operates to separate the pixel response of the defined photosensitive region from that of the transistor regions and, thus, achieve a more uniform pixel response across the pixel array. The use of additional light shields, however, result in reduced pixel fill factor and lower Quantum Efficiency (QE) performance (and thus, degraded performance), and place design constraints for constructing active pixels sensors, as will be explained with reference to FIG. 3.

FIG. 3 is a schematic side view of a unit pixel of a conventional CMOS active pixel sensor having a separate light shield layer. In particular, FIG. 3 illustrates a portion of a unit pixel formed in an active region of a semiconductor substrate (30) defined by an isolation layer (31). A photodiode element PD and diffusion regions (32) and (33) are formed in the active silicon region of the pixel. A stacked structure (34) is formed over the substrate (30). The stacked layers (34) include a plurality of gate electrodes (e.g., transfer and reset transistors Tx and Rx) and alternating layers of transparent dielectric layers and opaque metal layers that form the BEOL metallization interconnects. A upper metal layer is formed to operate as a light shield (34a) having a defined opening (aperture) (34b) of width, w, which is aligned to the PD element in the substrate (30). Some incident light on the pixel surface is reflected/blocked by the metal shield (34a) and some incident light enters through the aperture (34b) and passes through a tunnel region (34c) of the stacked layers (34) (which is devoid of metal lines of the BOEL structure) and is absorbed by the PD element.

Although the light shield (34a) can increase uniformity of pixel-to-pixel response, the use of the separate light shield layer (34a) lowers the pixel sensitivity. Indeed, the use of the additional light shield layer (34a) results in an increase in the height h of the stacked layers (34), and thus increases the aspect ratio of the tunnel height to the aperture width (i.e., the ratio of h/w). As the aspect ratio increases, the amount of incident light that can pass through the aperture (34b) to the PD element decreases as a result in the limited angle of incidence, which results in lower pixel sensitivity and lower QE. As CMOS technology scales to smaller feature sizes, smaller size pixels and light shield apertures can be formed to increase integration density. On a practical level, however, the size of active pixels sensors will be limited despite smaller available design rules due to a required level of pixel sensitivity needed for effective operation. Indeed, as the pixels with separate light shields are constructed with smaller design rules, the aspect ratio of the tunnel height h to the aperture width w increases, which results in decreased pixel sensitivity. Thus, to enable smaller design rules, it is desirable to limit the height h of the stacked layers (34) above the substrate (30), while using effective light shielding to minimize variation of pixel-to-pixel sensitivity across a pixel array.

SUMMARY OF THE INVENTION

In general, exemplary embodiments of the invention include solid state CMOS active pixel sensor devices having improved response uniformity. More specifically, exemplary embodiments of the invention include methods for fabricating CMOS active pixel sensors having pixel arrays with unit pixels that are designed to provide increased uniformity of pixel-to-pixel sensitivity across the pixel array without the need for an additional light shielding layer. In one exemplary embodiment of the invention, CMOS active pixel sensors comprise unit pixels frameworks in which one or more lower-level metallization layers are designed to provide BEOL interconnections and I/O and control lines, as well as operate as light shielding layers that increase uniformity of pixel-to-pixel sensitivity. In particular, one or more lower-level metallization layers are symmetrically patterned and arranged around the light receiving elements to balance the amount of incident light reaching the photosensitive regions.

In one exemplary embodiment of the invention, an image sensing device includes a pixel array comprising a plurality of unit pixels formed in a semiconductor substrate. Each unit pixel comprises a plurality of readout elements and at least one light receiving element. A first wiring layer is formed over the pixel array, which comprises a first pattern of wiring lines. The first pattern of wiring lines includes electrical interconnections between readout elements in the unit pixels, wherein the first wiring layer is an optical blocking layer to block incident light in each unit pixel to maintain substantially the same sensitivity for each light receiving element of the pixel array.

In another exemplary embodiment, a second wiring layer is formed over the first wiring layer. The second wiring layer includes a second pattern of wiring lines, wherein the second pattern of wiring lines includes voltage supply lines. The second wiring layer is a second optical blocking layer that further blocks incident light in each unit pixel to maintain substantially the same sensitivity for each light receiving element of the pixel array.

In other exemplary embodiments of the invention, the first pattern of wiring lines includes pixel control lines having dummy protruding elements, and the second pattern of wiring lines include pixel I/O lines having dummy protruding elements. The voltage supply lines may include dummy protruding elements.

In another exemplary embodiment, the first pattern of wiring lines is formed of a first unit pattern that is repeated in each unit pixel in the pixel array, and the second pattern of wiring lines is formed of a second unit pattern that is repeated in each unit pixel in the pixel array. The first and second unit patterns for each unit pixel are arranged to define an aperture of similar size and shape in each unit pixel to expose a light receiving region of each unit pixel. The light receiving region of each unit pixel includes an active region that includes the light receiving element of the unit pixel. The light receiving region of each pixel may further include at least a portion of a non-active region adjacent the active region including the light receiving element.

In yet another exemplary embodiment of the invention, each unit pixel is a shared unit pixel comprising a first sub-pixel unit and a second sub-pixel unit. The first pattern of wiring lines comprises a first unit pattern that is repeated in each unit pixel in the pixel array, and the first unit pattern comprises a sub-unit pattern that is repeated in each sub-pixel unit of each unit pixel in the pixel array. The sub-unit pattern comprises a pad element, wherein the pad element is as an isolated dummy pad element for the first sub-pixel unit, and wherein the pad element is an electrical contact pad for the second sub-pixel unit that is connected to a readout element of the second sub-pixel unit. In another embodiment, the sub-unit patterns of the first and second sub-pixel units form a mirror image pattern.

These and other exemplary embodiments, aspects, objects, features and advantages of the present invention will become apparent from the following detailed description of exemplary embodiments, which is to be read in connection with the accompanying drawings.

BRIEF DESCRIPTION OF THE DRAWING S

DETAILED DESCRIPTION OF EXEMPLARY EMBODIMENTS

Figure 1:
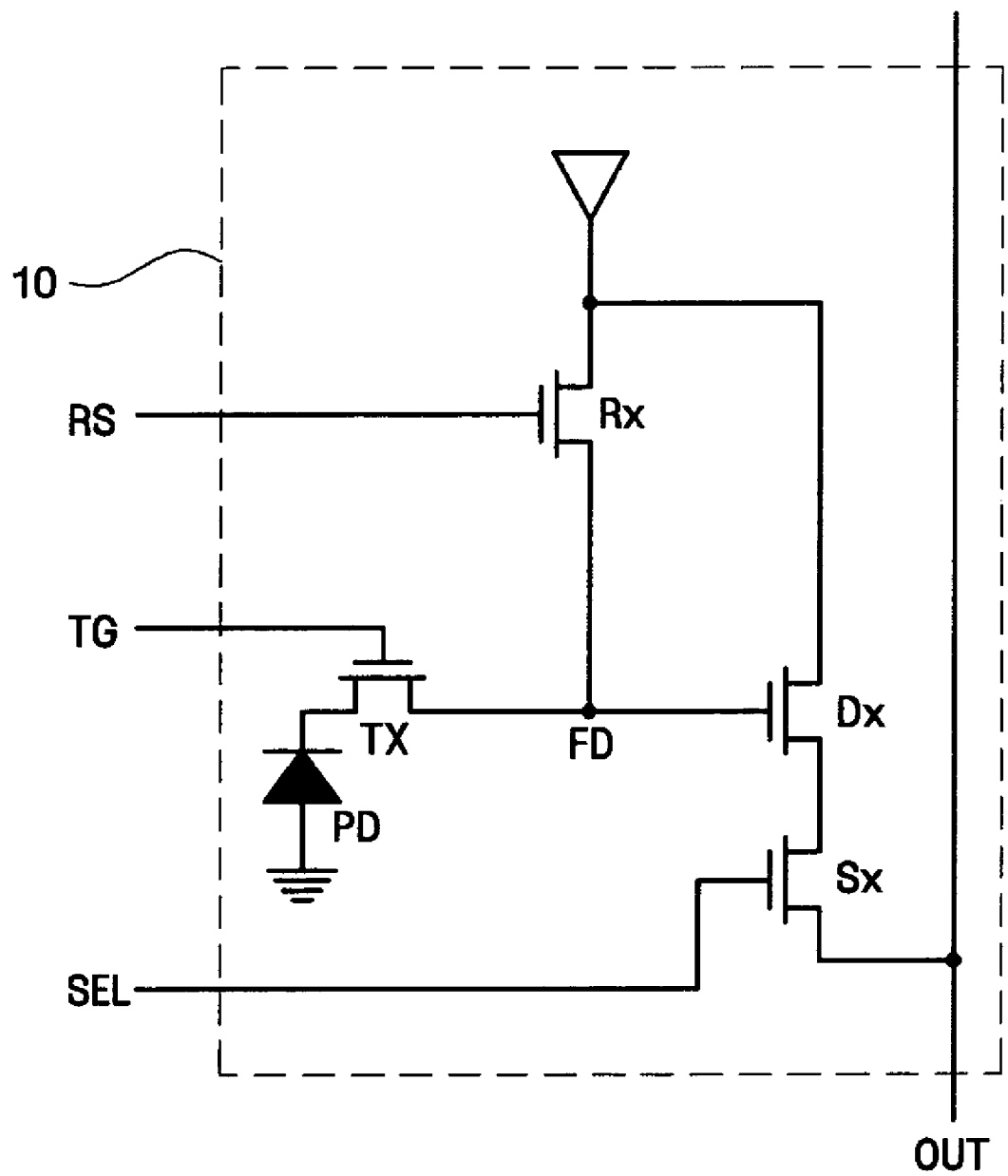
FIG. 1 is a schematic circuit diagram illustrating a unit pixel of a conventional CMOS image sensor device having a 4-transistor (4-T) active pixel sensor framework.

Exemplary embodiments of solid state CMOS active pixel sensor devices having improved response uniformity will now be discussed in further detail with reference to accompanying drawings. It is to be understood that the drawings are merely schematic depictions where the thickness and dimensions of various components, layers and regions are not to scale, but rather exaggerated for purposes of clarity. It is to be further understood that when a layer is described herein as being "on" or "over" another layer or substrate, such layer may be directly on the other layer or substrate, or intervening layers may also be present. It is to be further understood that the same reference numerals used throughout the drawings denote elements that are the same or similar or have the same or similar functions.

Figure 2:
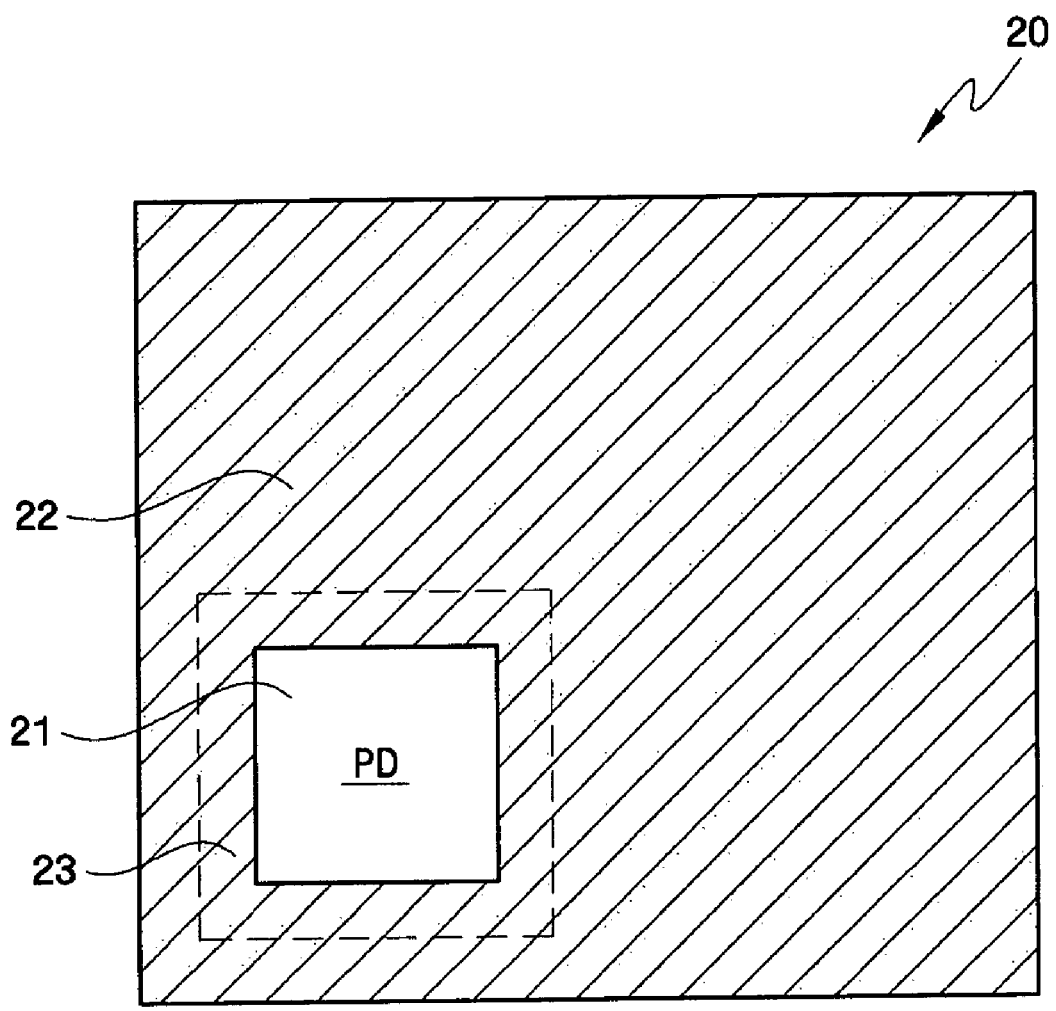
FIG. 2 illustrates an exemplary unit pixel layout to illustrate the concept of pixel fill factor.
Figure 3:
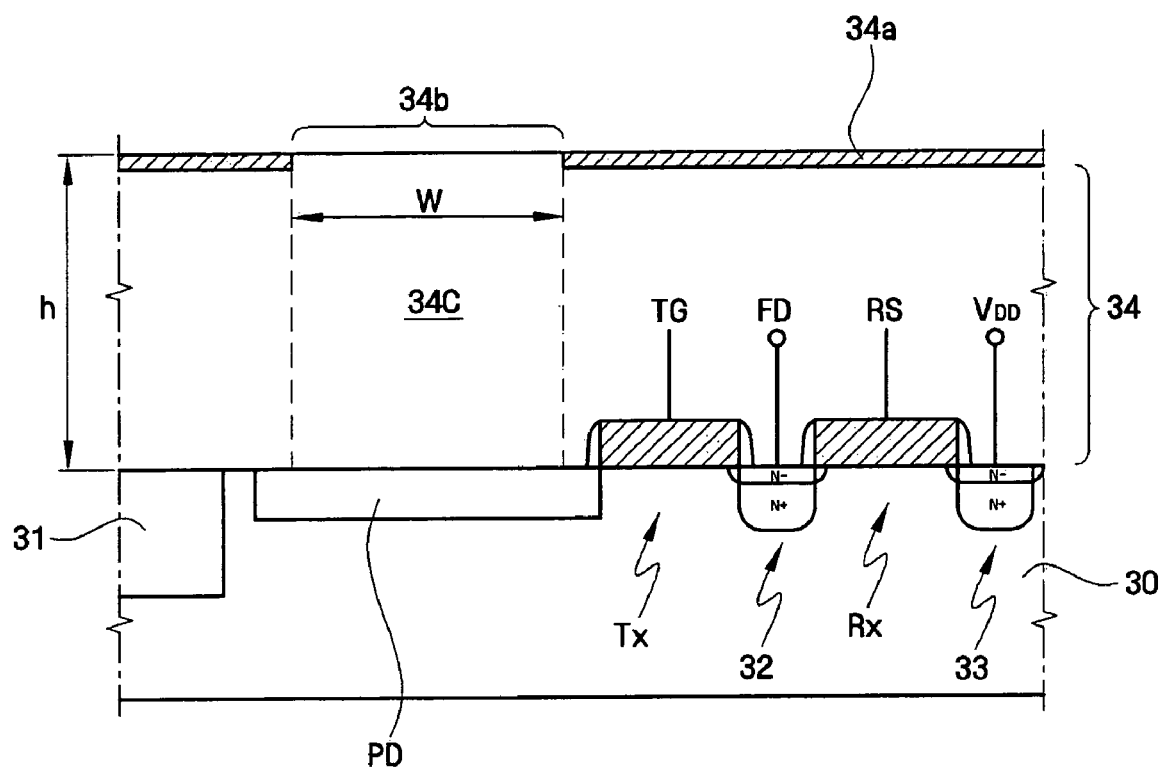
FIG. 3 is a schematic side view of a conventional unit pixel having a light shield layer.

In general, exemplary embodiments of the invention as described herein include methods for fabricating CMOS active pixel sensors having pixel arrays in which the pixel structures are designed to provide increased uniformity of pixel-to-pixel sensitivity across the pixel array without the need for an additional light shielding layer. The exemplary pixel structure of FIG. 2 can be used to explain general inventive concepts of the invention. As noted above, FIG. 2 depicts a unit pixel (20) having a photosensitive region (21) and transistor region (22). For purposes of the present invention, it is assumed that the photosensitive region (21) (or "PD region") represents the area of the active silicon region in which a photodiode is formed according to a "design" fill factor. A peripheral region (23) surrounding the PD region (21) denotes a portion of the transistor region (22) where photo-generated charges are most likely to be collected by the PD element, but may diffuse to other areas of the pixel, resulting in non-uniformity of pixel sensitivity across the array. For illustrative purposes, the combination of PD region (21) and the peripheral region (23) is referred to herein as an effective photosensitive region (or "EPS region"). It is to be understood that the EPS region illustrated in FIG. 2 is merely exemplary, as the EPS region of an active pixel sensor will vary based on various factors such as the actual size and structure of the PD element, the spatial and electronic relationship of the PD element to adjacent components in the pixel, etc.

In one exemplary embodiment of the invention, CMOS active pixel sensors comprise unit pixels frameworks in which one or more lower-level metallization layers are designed to provide BEOL interconnections, as well as operate as light shielding layers that increase uniformity of pixel-to-pixel sensitivity. In particular, one or more lower-level metallization layers are symmetrically patterned and arranged around the PD region (21) of each pixel to operate as light shielding (blocking) layers that balance the amount of incident light reaching the photosensitive regions. The metallization layers are patterned to effectively define symmetrical apertures in each pixel which expose the same amount and/or same portions the EPS regions for each pixel in the array. The exposed EPS regions can include all (or substantially the entire photosensitive region (21) and at least a portion of the peripheral region (23). In this manner, the metallization patterns provide substantially the same light shielding area, thus providing even distribution of incident light receiving efficiency. The elimination of the additional light shielding layer allows a reduction is the BOEL metallization to be reduced thus, resulting in increased fill factor and sensitivity.

Figure 4:
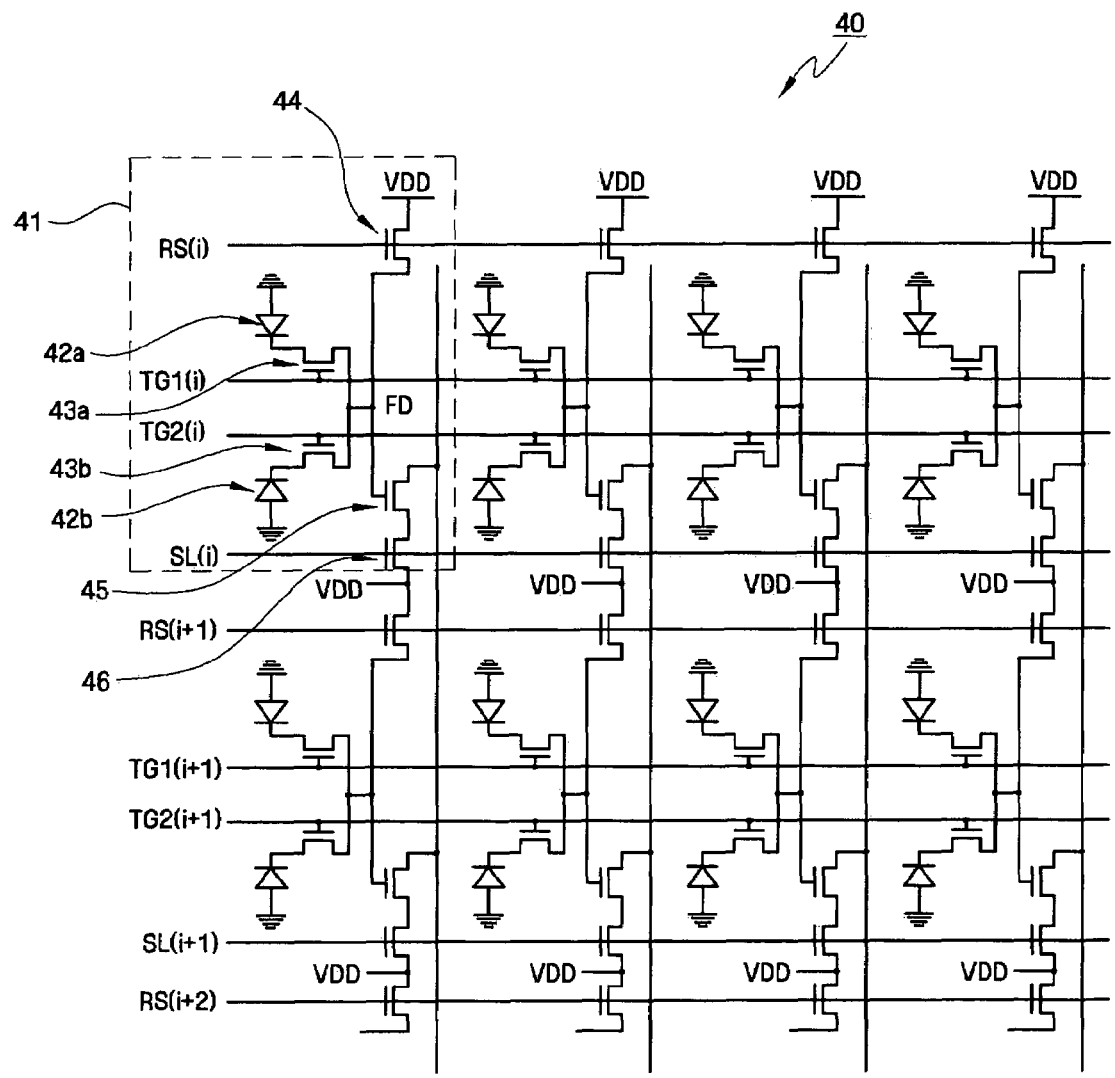
FIG. 4 is a schematic circuit diagram of an active pixel sensor array having a shared pixel framework to which the present invention can be applied.

The general inventive concepts with regard to pixel structure and metallization patterns as described above with reference to FIG. 2 can be can be implemented for various types of CMOS active pixel image sensors including 3-T, 4-T, 5-T active pixel sensors, as well as shared and non-shared CMOS active pixel sensor architectures. For purposes of illustration, exemplary embodiments of the invention will be discussed hereafter in detail with reference to shared unit pixels frameworks such as depicted in FIGS. 4-10. In particular, FIG. 4 is a schematic circuit diagram of a pixel array having a shared pixel framework to which the present invention can be applied. FIGS. 5-10 illustrate a method for constructing a semiconductor CMOS active pixel image sensor device based on the pixel array circuit structure of FIG. 4, and having unit pixels with symmetrical structures to provide uniform sensitivity. It is to be understood, however, that the invention is not limited to shared pixel structures, and one of ordinary skill in the art could readily envision the implementation of the invention concepts to various pixel framework based on the teachings herein.

Referring to FIG. 4, a pixel array (40) is shown comprising a plurality of unit pixels (41). Each unit pixel (41) comprises two photodiodes (42a) and (42b) and two transfer transistors (43a) and (43b) that are commonly connected to a FD region (sensing node). Each unit pixel (41) further comprises a reset transistor (44), an amplifier transistor (45) and a select transistor (46). The voltage source VDD is connected to the reset transistor (44) and the selection transistor (46). The shared pixel structure provides higher density designs for a given chip size. The pixels (41) operate similar to the 4-T active pixel sensor discussed above with reference to FIG. 1. During an integration phase, incident light on photo-sensitive regions of the unit pixels (41), which include the photodiodes (42a) and (42b), results in photo-generated charges that are collected by potential wells (or collecting junctions) of the photodiodes (42a) and (42b). During a charge transfer phase, the collected charges are transferred from the photodiodes (42a) and (42b) to the FD region by activation of the respective transfer gates (43a) and (43b).

In accordance with an exemplary embodiment of the invention, the unit pixels (41) can be constructed with symmetrical structures that provide uniform pixel-to-pixel sensitivity across the array (40) without the need for a separate, additional light blocking layer. FIGS. 5-10 illustrate a method for fabricating an image sensor device having a shared pixel architecture as illustrated in FIG. 4, according to an exemplary embodiment of the invention. In particular, as will be explained in further detail below with reference to FIGS. 5-10, the metallization layers of the unit pixels, which provide the interconnects between the active components and I/O signal lines for the pixels, are symmetrically patterned and arranged around the photodiode regions of the pixels to act as light blocking shields that define symmetrically similar light receiving regions in each unit pixel across the pixel array.

Figure 5A:
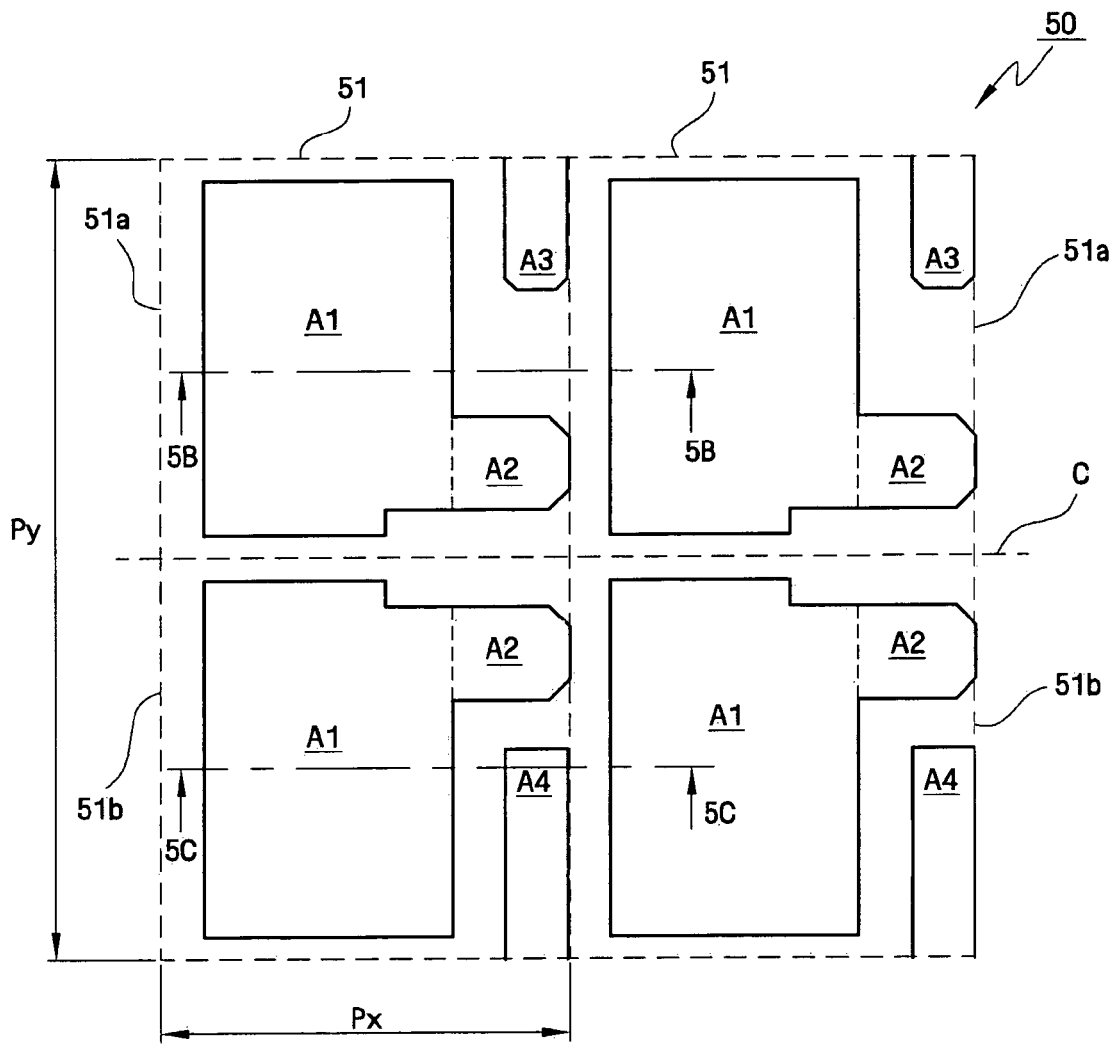
FIGS. 5-10 illustrate a method for constructing a semiconductor CMOS active pixel image sensor device based on the pixel array circuit structure of FIG. 4, and having unit pixels with symmetrical structures to provide uniform sensitivity.
Figure 5B:
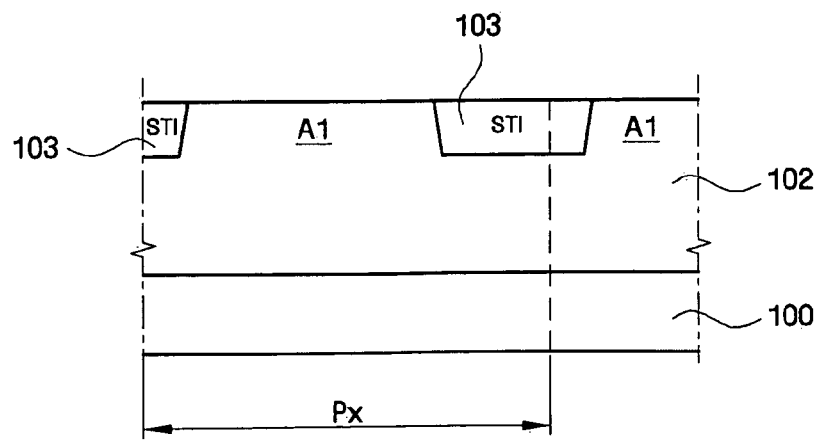
Figure 5C:
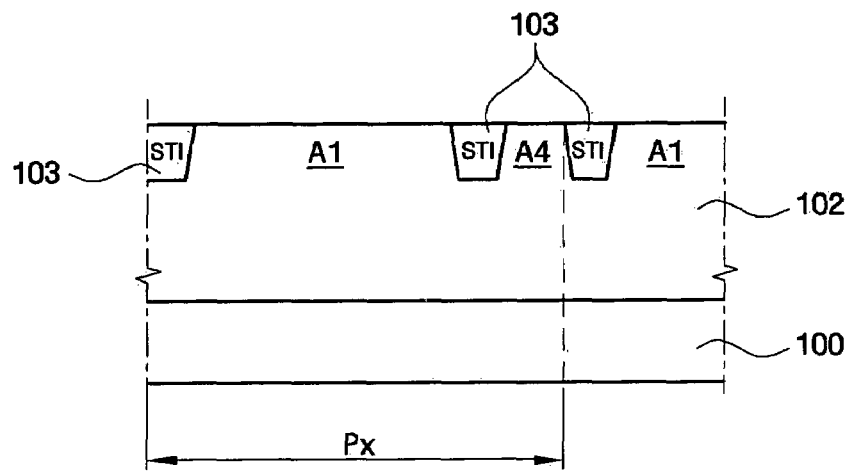

FIGS. 5A~5C illustrate initial steps for fabricating an image sensor device according to an exemplary embodiment of the invention. In particular, FIG. 5A is a schematic plan view of a pixel array (50) which illustrates an initial layout pattern of active areas for unit pixels (51) having a shared active pixel sensor framework. Moreover, FIG. 5B is a schematic cross-sectional view along line 5B-5B of FIG. 5A and FIG. 5C is a schematic cross-sectional view along line 5C-5C of FIG. 5A.

As depicted in FIG. 5A, each unit pixel (51) in the array (50) occupies the same pixel area $P_{Area}$, which for purposes of illustration, is denoted by $P_{Area}=P_X \times P_Y$, where $P_X$ denotes the width of a unit pixel (51) (in a row direction) and $P_Y$ denotes the length of a unit pixel (51) (in a column direction) as defined by the dotted lines depicted in FIG. 5A. Furthermore, in the exemplary embodiment of FIG. 5A, each unit pixel (51) comprises a pair of sub-pixel units (51a) and (51b). In FIG. 5A, each sub pixel unit (51a) occupies an upper portion of the unit pixel (51) above a centerline C, and each sub pixel unit (51b) occupies a lower portion of the unit pixel (51) below the center line C. The sub-pixel units (51a) and (51b) are deemed to occupy the same area $P_{SubArea}=\frac{1}{2}P_{Area}$ above and below the centerline C.

As depicted in FIGS. 5A~C, each unit pixel (51) includes a plurality of active regions A1, A2, A3 and A4, which are defined by an isolation region (103) formed in an epitaxial substrate layer (102) of a semiconductor substrate (100). In one exemplary embodiment of the invention, the substrate layer (102) is a p-doped layer formed using conventional methods. The substrate layer (102) may be formed with phosphorous dopants. It is to be understood that in other exemplary embodiments, the doped layer (102) may be an N-doped layer. The substrate (100) can be n-type or p-type. The isolation region (103) can be formed of any suitable insulation material such as silicon dioxide, using known methods such as shallow trench isolation (STI) or local oxidation of silicon (LOCOS) methods.

In the exemplary embodiment, each unit pixel (51) comprises two active regions A1. The active regions A1 are photosensitive regions in which light receiving elements (e.g., photodiodes) are formed. The active regions A2, A3 and A4 of each unit pixel (51) are active regions for the pixel transistors. In particular, the active regions A2 extend from the active regions A1, and define the active regions for the transfer transistors and FD regions. The active regions A3 and A4 define active regions for the reset and amplifier transistors. As depicted in FIG. 5A, the shape formed by active regions A1/A2 in sub-pixel unit (51a) is a mirror image of the shape formed by the active regions A1/A2 of sub-pixel unit (51b) with respect to the centerline C of the unit pixel (51). The active regions A3 and A4 of a given unit pixel (51) are integrally connected to the active regions A4 and A3, respectively, of contiguous unit pixels above and below the unit pixel (51). More specifically, the active region A4 of a sub-pixel unit (51b) of one unit pixel (51) extends as active region A3 into a sub-pixel unit (51a) of an adjacent unit pixel (51). As shown in the exemplary embodiment of FIG. 5A, the active regions A1, A2, A3 and A4 are symmetrically formed in each pixel (51) across the array (50). In other words, the active regions A1, A2, A3 and A4 define a unit pattern for active regions, which is repeated for each unit pixel (51) across the pixel array (50). In this regard, the active regions A1/A2/A3 define a sub unit pattern for each sub pixel unit (51a) across the array (50) and the active regions A1/A2/A4 define a sub unit pattern for each sub pixel unit (51b) across the array (50)

Figure 6A:
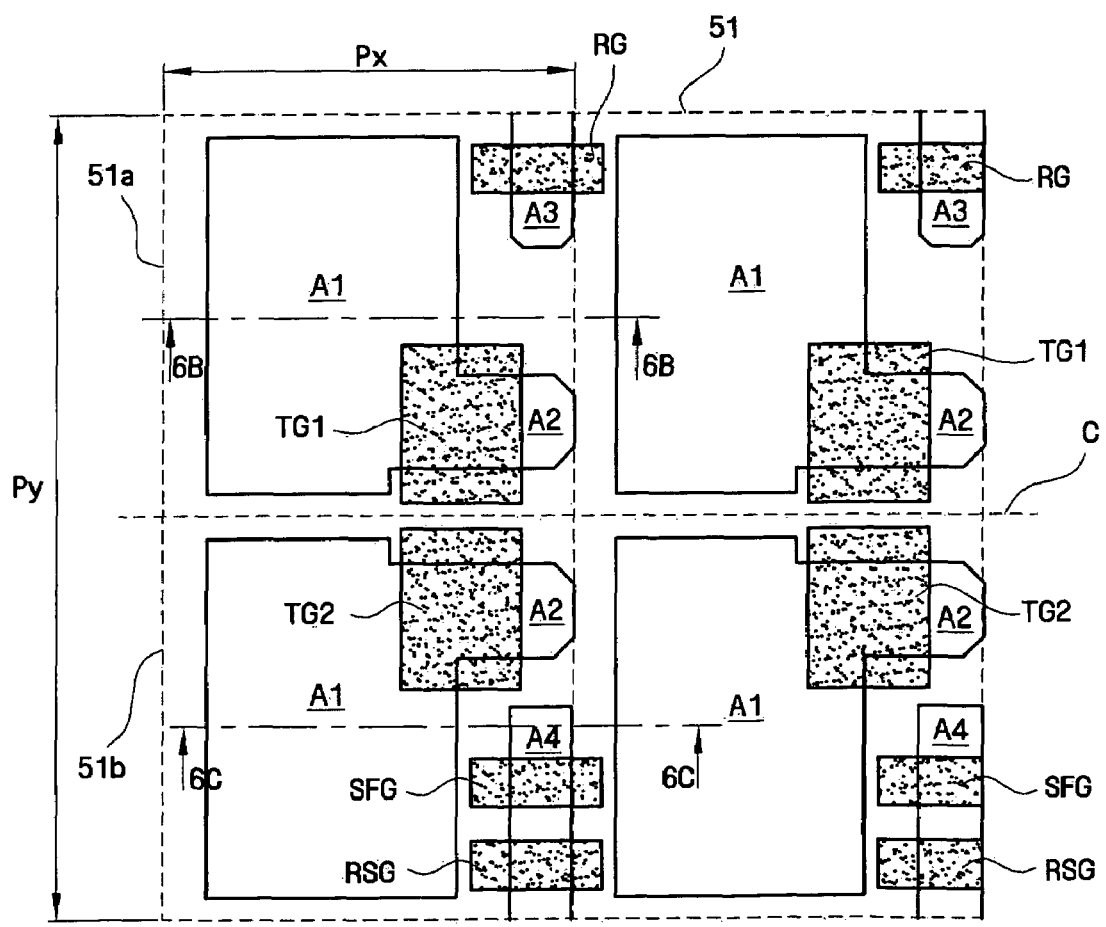
Figure 6B:
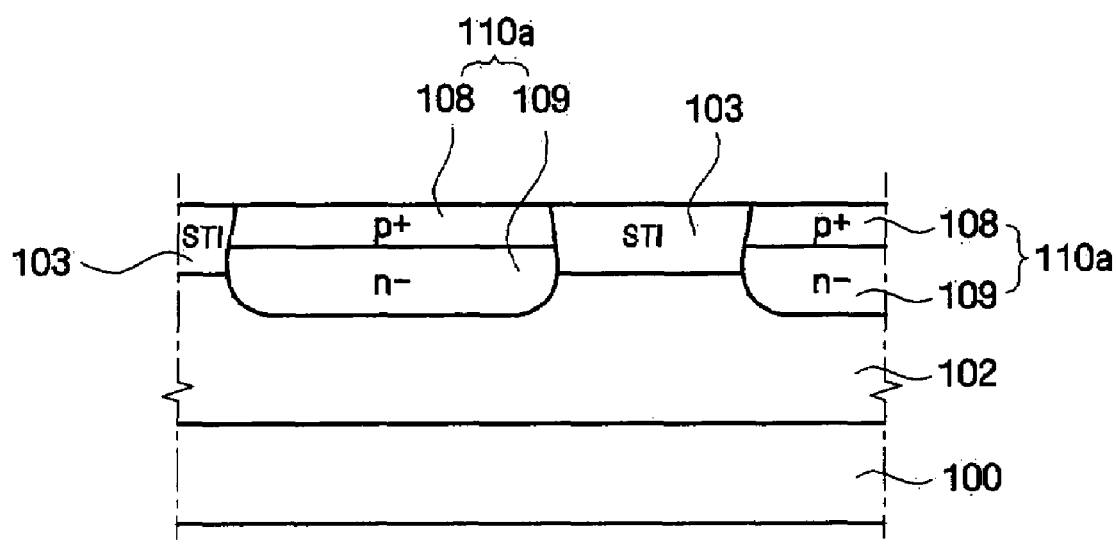
Figure 6C:
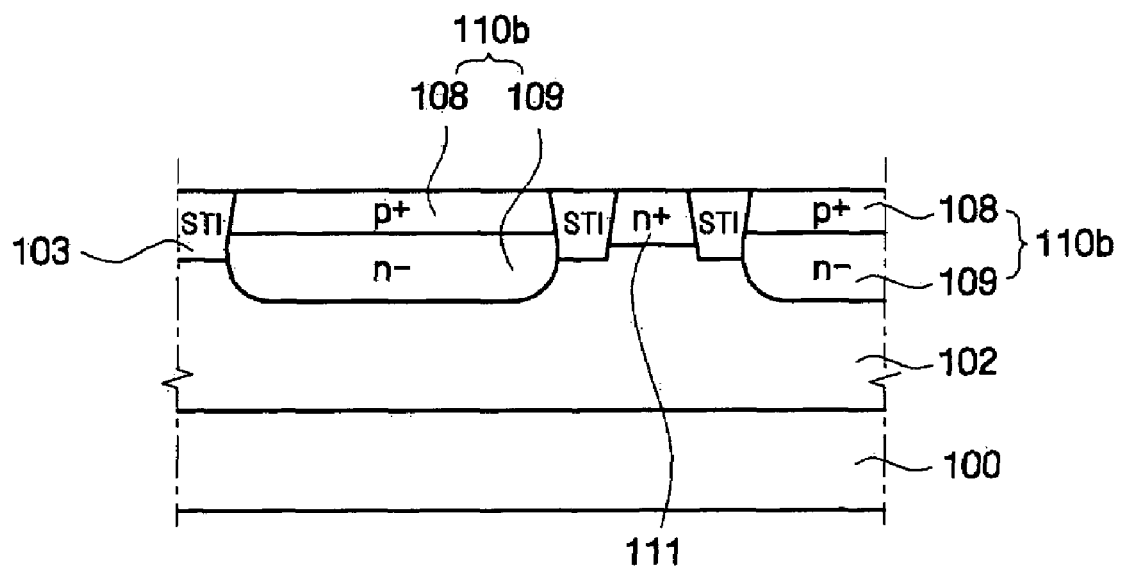

FIGS. 6A, 6B and 6C illustrate the exemplary pixel sensor array (50) after formation of gate electrodes for the active transistors and light receiving elements (e.g., photodiodes). In particular, FIG. 6A is an exemplary top plan view illustrating a layout pattern of gate electrodes of the unit pixels (51). FIGS. 6B and 6C are schematic cross-sectional views of FIG. 6A along lines 6B-6B and 6C-6C, respectively, which illustrates light receiving elements (110a, 110b) formed in the active regions A1 and an n+ diffusion region (111) formed in a portion of the active region A4.

As depicted in FIG. 6A, each unit pixel (51) comprises various gate electrodes formed at locations along the transistor active regions A2, A3 and A4, including transfer gate electrodes (TG1, TG2) (or transfer gates) of transfer transistors TX, reset gate electrodes (RG) (or reset gates) of reset transistors RX, source follower gate electrodes (SFG) of an amplifier transistor DX and select gate electrodes (RSG) of select transistors SX. The gate electrodes are formed to overlap portions of the transistor active regions and portions of the isolation region (103) adjacent thereto.

As depicted in FIGS. 6B and 6C, a light receiving element (110) is formed in the active regions A1 of the unit pixels (51). The light receiving element (110) comprises comprises a p+ layer (108) (or HAD (hole accumulation diode) layer) and a buried n-well layer (109) formed below the p+ layer (108) The stacked p+/n/p layers (108)/(109)/(102) form a pinned photodiode device, as is known in the art. Pinned photodiodes are typically implemented in active pixel sensor designs because of various advantages afforded by such devices. For example, a pinned photodiode device allows complete charge transfer from the PD region to the FD region (160). Further, the p+ layer (108) provides reduced dark current (as compared to conventional photodiodes) by separating the buried n-well layer (109) from the silicon surface and causes photo-generated charges in the PD region to be accumulated and confined in the buried n-well layer (108). As such, the p+ layer (108) effectively shields the n-well (109) from thermally generated charges at the active silicon surface, resulting in a reduction of dark current and corresponding noise elements. Moreover, the p+ layer (108) operates to increase the spectral response of the pixel by capturing short-wavelength visible light (blue light) in the junction between the p+ and n-well layers, while the deeper p/n-well junction can capture of longer wavelengths of light (red and infrared).

Although not specifically depicted, additional processing steps are performed to form the drain/source doped regions in relevant portions of the active regions A2, A3 and A4 for the active pixel transistors. For instance, FD diffusion regions are formed in the active regions A2 adjacent the transfer gate electrodes TG1 and TG2. Furthermore, as depicted in FIG. 6C, N+ doped regions are formed in relevant portions of the active regions where via connections (to be subsequently formed) are contacted to the active regions. For instance, as shown in FIG. 6C, a doped region (111) is formed in an end portion of the active region A4 adjacent the source follower gate SFG. The doped region (111) forms a source/drain region of the amplifier (buffer) transistor that drives an output line (column line) of the pixel array (50), and serves as via contact point (as will be explained below).

The gate electrodes depicted in FIG. 6A can be formed using conventional methods. For instance, the gate electrodes can be formed by sequentially forming an insulating layer and conductive layer sequentially over the substrate. The insulating layer may be an oxide layer (or silicon oxide layer) that is formed by thermal oxidation. In other exemplary embodiments, the insulation layer may be formed by depositing an insulating material such as silicon nitride, ONO, etc., using known methods such as CVD (chemical vapor deposition) or ALD (atomic layer deposition) methods. The conductive layer may be formed of polysilicon that is deposited using CVD. The gate electrodes may be formed of other materials such as tungsten, copper, or other suitable gate electrode material. An etch process is performed using a suitable mask pattern to form the gate electrodes for the unit pixels (51). In one exemplary embodiment of the invention, the insulation layer is maintained to protect the silicon substrate surface during subsequent etch processes. In another exemplary embodiment, the insulation layer can be etched using the same etch mask for forming the gate electrodes, so as to define the gate insulation layers for the gate electrodes.

Furthermore, the photodiodes (110a, 110b) can be formed using conventional methods. For instance, in one exemplary embodiment, a photoresist pattern is formed having openings that expose the active regions A1. Then, separate ion implantation methods are performed to implant dopants into the exposed active regions A1 to form the photodiodes (110). For example, a first implantation process is performed to implant p-type impurities, for example boron ions, into the exposed active regions A1 with a first ion implantation energy to form the hole accumulation layer (108) layer. The implanted boron ions are activated to form the p+ layer (108)). A second ion implantation method is performed to implant n-type impurities (e.g., phosphorous or arsenic ions) into the active regions A1 with a second ion implantation energy to form the buried n-well layer (109).

Figure 7A:
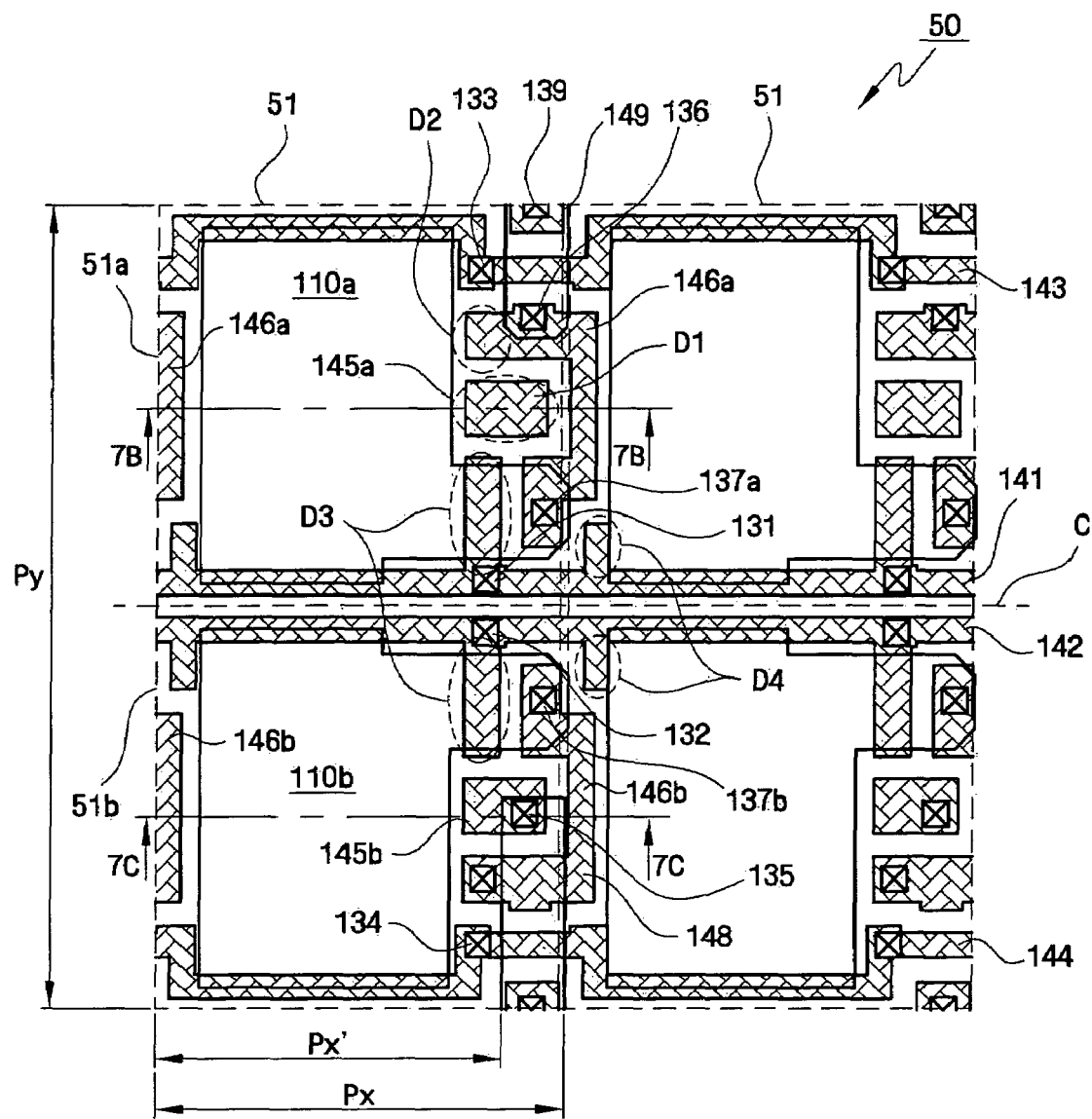
Figure 7B:
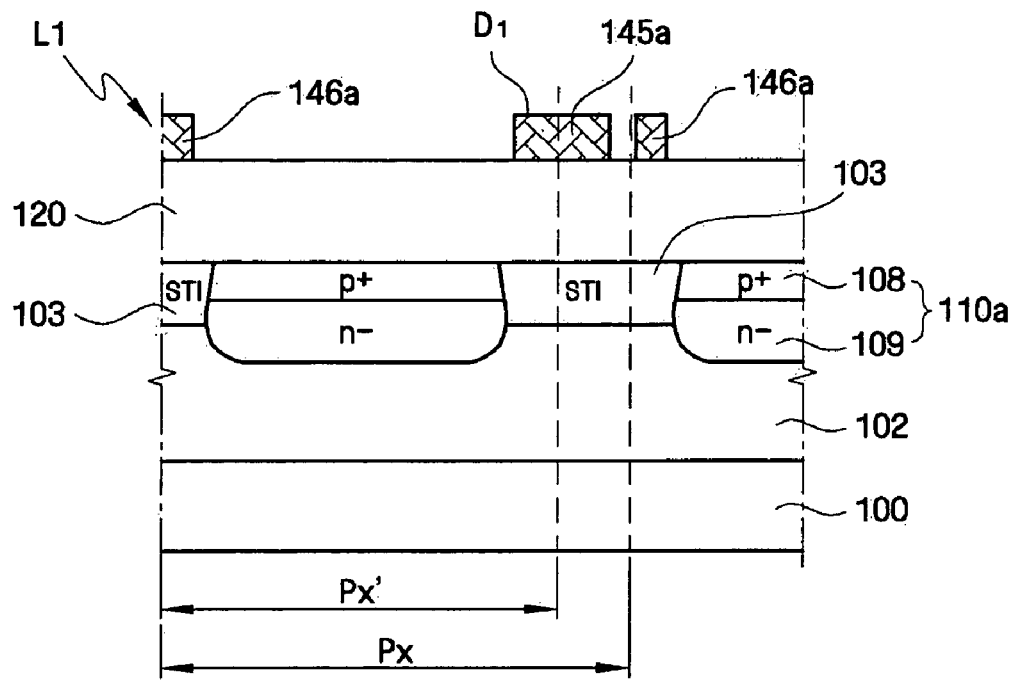
Figure 7C:
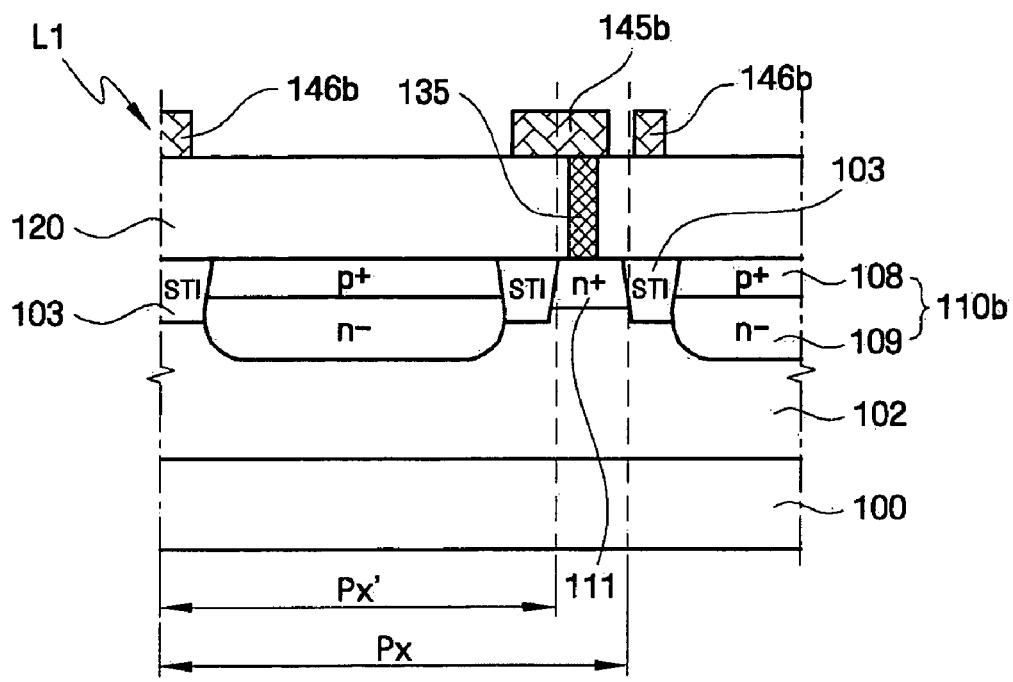

FIGS. 7A, 7B and 7C are exemplary diagrams that illustrate the pixel sensor array (50) after formation of a first-level metallization pattern according to an exemplary embodiment of the invention. In particular, FIG. 7A is schematic top plan view illustrating an exemplary first-level metallization pattern (L1) of the pixel sensor array (50), while FIGS. 7B and 7C are schematic cross-sectional views of the pixel image sensor array (50) of FIG. 7A along lines 7B-7B and 7C-7C, respectively.

In accordance with an exemplary embodiment of the invention, the first-level metallization pattern (L1) is designed to serve various purposes. For instance, the first-level metallization pattern (L1) includes wires and interconnects to provide electrical connections between pixel components and support pixel I/O. In addition, the first-level metallization pattern (L1) operates as a light blocking layer having a repeating, symmetrical pattern in each pixel (51) across the array (50), which is designed to equalize the sensitivity of the photodiodes (110a and 110b) in each unit pixel (51) and across the photodiodes of the unit pixels (51) over the array (50). The first-level metallization pattern (L1) is formed to effectively configure, or otherwise define, light receiving regions in each pixel which are symmetrical. As discussed above with reference to FIG. 5A, each unit pixel (51) in the array (50) is occupies the same pixel area $P_{Area}=P_X \times P_Y$, Furthermore, in the exemplary embodiment of FIG. 7A, for purposes of illustration, an EPS (effective photosensitive) region of each pixel (51) occupies an area defined by $A_{EPS}=P'_X \times P_Y$, wherein $P'_X$ denotes the width of the EPS region in a row direction (which is smaller than $P_X$) and wherein $P_Y$ denotes the length of the EPS region in the column direction (which is the same as the length of the pixel unit (51) in the column direction). In particular, as depicted in FIG. 7A, an exemplary EPS region of each unit pixel (51) includes the pixel area occupied by the photodiodes (110a and 110b) as well as a peripheral area surrounding the photodiodes (110a and 110b).

Referring to FIG. 7A, the first-level metallization pattern (L1) includes various control lines, including an RG (reset gate) control line (143), TG (transfer gate) control lines (141) and (142), and a RSG (row select gate) control line (144). The RG control line (143) is connected to the RG electrodes of all unit pixels (51) in a given row of the array (50) by via connections (133). The RSG control line (144) is connected to the SG electrodes of all unit pixels (51) in a given row of the array (50) by via connections (134). The TG control lines (141) and (142) are connected to the TGa and TGb (transfer gate) electrodes of all unit pixels (51) in a given row of the array (50) by via connections (131) and (132), respectively.

In addition, the first-level metallization pattern (L1) includes metallic pads (145a), (145b) and (149) and interconnect lines (146a) and (146b). The pad (145b) is connected to the doped region (111) by a via connection (135). The pad (149) is shared by contiguous unit pixels (in column direction) and is connected by a via connection (139) to a shared doped region (source/drain region) of the row select and buffer amplifier transistors. The interconnect line (146a) provides an electrical connection between the reset transistor and the upper FD region. In particular, one end of the interconnect line (146a) is connected to a source region of the reset transistor by via plug (136) and to an upper floating diffusion region by a via plug (137a). The interconnect line (146b) provides an electrical connection between the gate electrode (SFG) of the source follower transistor and the lower FD region. In particular, one end of the interconnect line (146b) is connected to the gate electrode of the source follower transistor by via plug (138) the other end of the interconnect (146b) is connected to the lower FD region by via plug (137b).

As depicted in the exemplary embodiment of FIG. 7A, the first-level metallization pattern (L1) operates as a light blocking layer, wherein the first-level metallization pattern (L1) is formed of a unit pattern that is repeated in each pixel (51)

across the array (50). In particular, the first-level metallization pattern (L1) is formed to have a symmetrical unit pattern (referred to as unit L1 pattern) that is repeated in each unit pixel (51) across the array. The unit L1 pattern is designed as a light blocking layer that defines symmetrically similar light receiving regions in each unit pixel (51) and operates to uniformly and symmetrically shield incident light from the light sensitive regions surrounding the photodiodes in each unit pixel (51) to thereby equalize the sensitivity of the photodiodes (110*a* and 110*b*) in each unit pixel (51) and across the photodiodes of the unit pixels over the array (50). The unit L1 pattern is symmetrically patterned and arranged to evenly cover peripheral regions surrounding the photodiodes (110*a*/110*b*).

In another exemplary embodiment, a unit L1 pattern for each pixel unit (51) is formed of a sub-unit pattern (or sub-unit L1 pattern) for each sub pixel unit (51*a*) and (51*b*), wherein the sub-unit L1 patterns of the sub-pixel units (51*a*) and (51*b*) form a mirror image pattern with respect to the centerline C of the unit pixel (51).

In particular, the transfer gate lines (141) and (142) extend in a row direction in a light sensitive area between the photodiodes (110*a*) and (110*b*) of the pixels (51). The transfer gate lines (141) and (142) are symmetrically patterned and arranged to provide equal light blocking area, and are disposed are arranged over the light sensitive regions surrounding the photodiodes (110*a*) and (110*b*), respectively to provide equal light blocking area and equalize the sensitivity of the diodes. Furthermore, the transfer gate lines (141) and (142) have symmetrical protruding portions D3 and D4. The protruding portions D3 and D4 are dummy elements that are formed to cover light sensitive regions in the EPS region and further define the light receiving area of the pixel and thus, equalize the sensitivity of the diodes. In the exemplary embodiment of FIG. 7A, the transfer gate lines (141) and (142) are mirror image patterns with respect to the centerline C between the sub-pixel units (51*a*) and (51*b*).

Similarly, the RG and RSG control lines (143) and (144) extend in a row direction in a light sensitive area between the photodiodes (110*a*) and (110*b*) of adjacent pixels (51) in the column directions. The control lines (143) and (143) are symmetrically patterned and arranged in each unit pixel (51) to provide equal light blocking area of light sensitive regions between photodiodes (110*a*) and (110*b*), respectively to provide equal light blocking area and equalize the sensitivity of the diodes. In the exemplary embodiment of FIG. 7A, the RG and RSG control lines (143) and (144) are mirror image patterns with respect to the centerline C between the sub-pixel units (51*a*) and (51*b*).

The pad element (145*b*) in each sub-pixel unit (51*b*) is formed to provide an electrical connection for via plug (135) and with an extended area to provide light shielding of the light sensitive region adjacent the photodiode (110*b*). The pad element (145*a*) in each sub-pixel unit (51*a*) is symmetrically patterned and arranged to compensate for the pad element (145*b*) of the corresponding sub-pixel unit (51*b*). In other words, the pad element (145*a*) is a dummy element D1 that has no electrical function but merely operates to shield incident light and equalizing the sensitivity of between the diodes (110*a*) and (110*b*). In the exemplary embodiment of FIG. 7A, the pad elements (145*a*) and (145*b*) are mirror image patterns with respect to the centerline C between the sub-pixel units (51*a*) and (51*b*).

The interconnect lines (146*a*) and (146*b*) are symmetrically patterned and arranged to enable light shielding and equalize the sensitivities of the photodiodes. The interconnects (146*a*) are formed with extending/protruding portions D2 which operate to compensate for the plug (138) contact portion of the lower interconnect (146*b*) and thus, equalize the areas and sensitivities of diodes (110*a*, 110*b*). In addition, the interconnects (146*a*, 146*b*) of a given unit pixel include elongated portions that are disposed to cover light sensitive areas of photodiodes in adjacent unit pixels (51). In the exemplary embodiment of FIG. 7A, the interconnects (146*a*) and (146*b*) are mirror image patterns with respect to the centerline C between the sub-pixel units (51*a*) and (51*b*).

FIGS. 7B and 7C are schematic cross-sectional views of FIG. 7A along lines 7B-7B and 7C-7C, respectively. A dielectric layer (120) is formed over the substrate using conventional methods. For instance, the dielectric layer (120) may be formed of silicon dioxide that is deposited using a CVD process. The via connections (or plugs) such as the via connection (135) (and other via connections described above in FIG. 7A) are formed using conventional methods. For instance, the via connections (e.g., plug 135) can be formed by etching the dielectric layer (120) to form via holes, depositing conductive material such as copper or tungsten using conventional methods to fill the via holes with the conductive material, and then perform an etch process or CMP process to remove conductive material on the surface of the dielectric layer (120) and planarize the surface. The first-level metallization layer (L1) can then be formed by depositing a conductive material such as copper or aluminum by sputtering and then patterning the conductive layer using a conventional photolithography process.

Figure 8A:
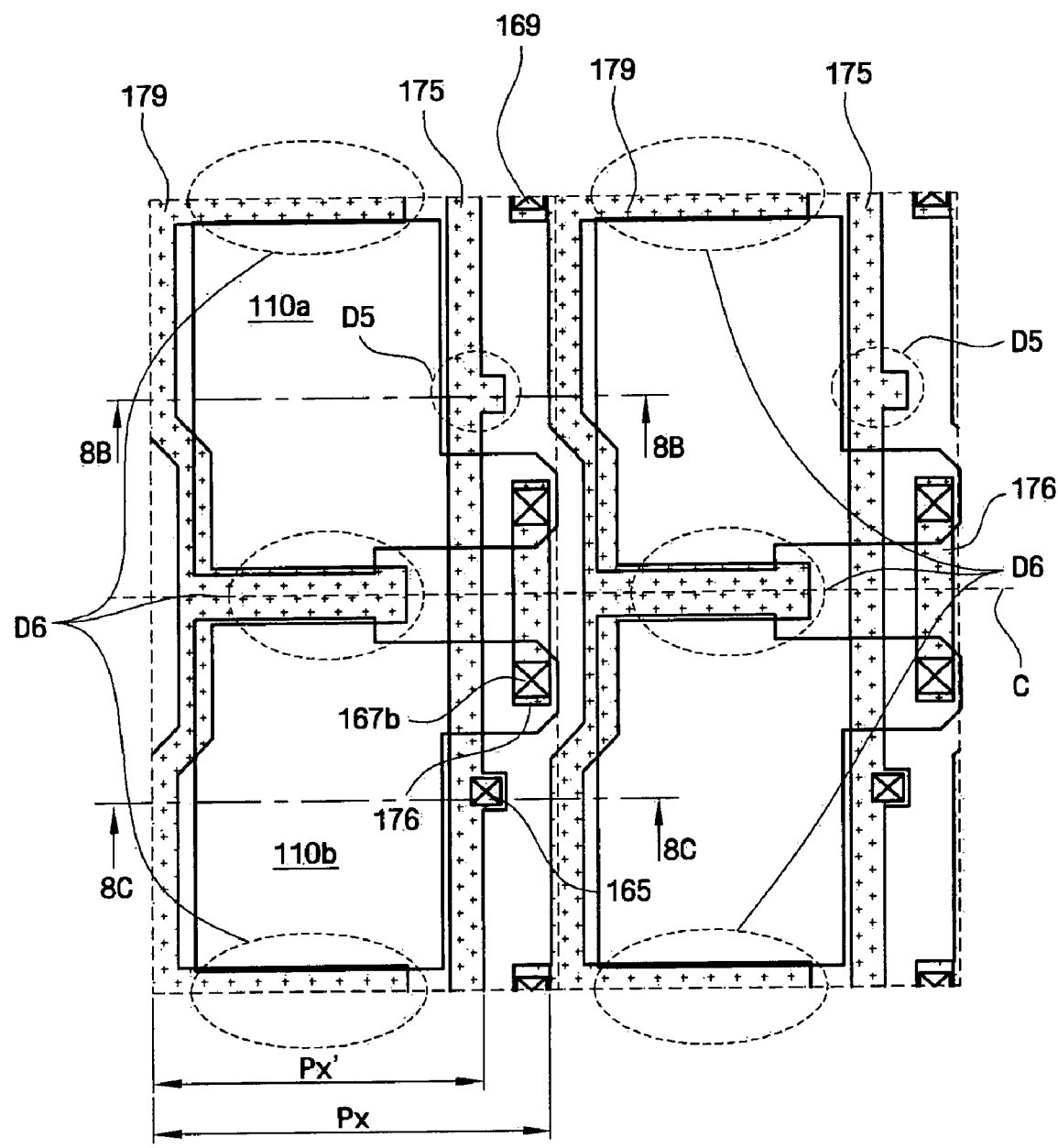
Figure 8B:
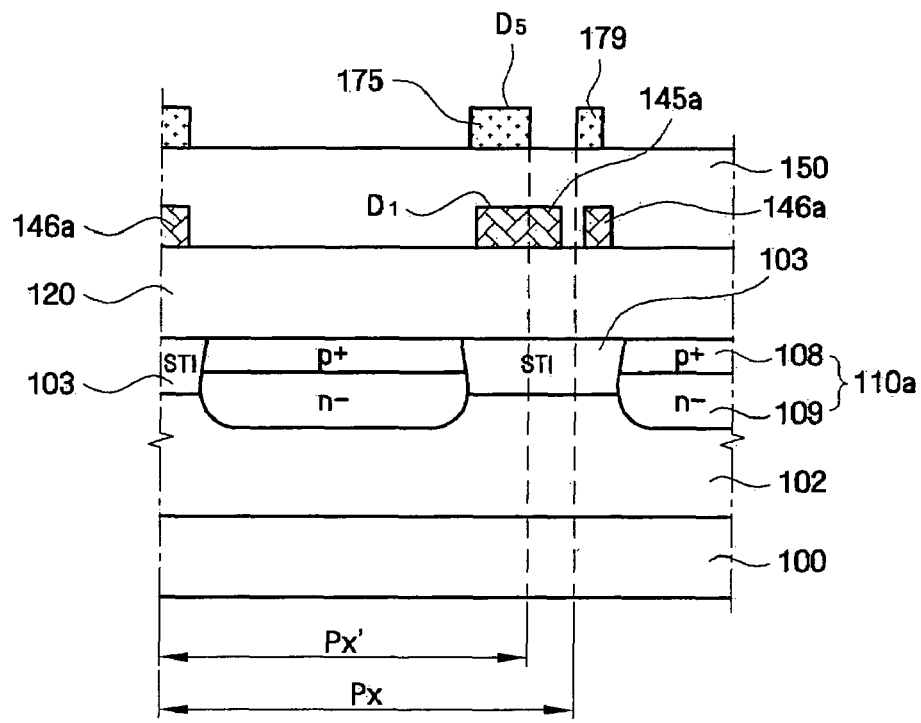
Figure 8C:
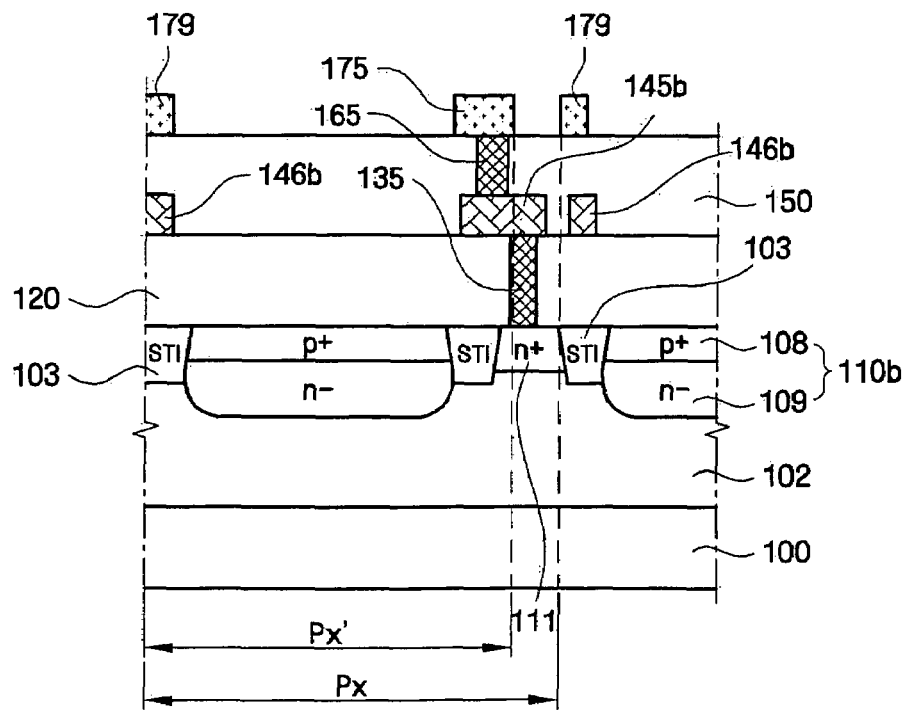

FIGS. 8A, 8B and 8C are exemplary diagrams that illustrate the pixel sensor array (50) after formation of a second-level metallization pattern (L2), according to an exemplary embodiment of the invention. In particular, FIG. 8A is schematic top plan view illustrating an exemplary layout of a second-level metallization pattern (L2) of the pixel sensor array (50), while FIGS. 8B and 8C are schematic cross-sectional views of the pixel image sensor array (50) of FIG. 8A along lines 8B-8B and 8C-8C, respectively.

In accordance with an exemplary embodiment of the invention, the second-level metallization pattern (L2) is symmetrically patterned and arranged around the PD elements (110*a* and 110B) in each unit pixel (51) to act as a light blocking layer that further defines/configures the light receiving area of each unit pixel (51) to further equalize the sensitivity of the photodiodes (110*a* and 110*b*) in each sub-pixel unit (51) and across the photodiodes across the pixel array (50).

In particular, in one exemplary embodiment of the invention as depicted in FIG. 8A, the second-level metallization pattern (L2) is formed to have a unit metallization pattern (referred to as unit L2 pattern) that is repeated in each unit pixel (51) across the array. The repeating unit L2 pattern is designed as a light blocking layer which, in conjunction with the repeating unit L1 pattern, further defines symmetrically similar light receiving regions in each unit pixel (51) and operates to uniformly and symmetrically shield incident light from the light sensitive regions surrounding the photodiodes in each unit pixel (51) to provide further pixel sensitivity equalization. Furthermore, in the exemplary embodiment of FIG. 8A, the unit L2 pattern for each pixel unit (51) comprises a sub-unit metallization pattern (or sub-unit L2 pattern) for each sub pixel unit (51*a*) and (51*b*), wherein the sub-unit L2 patterns of the sub-pixel units (51*a*) and (51*b*) are mirror images with respect to the centerline C of the unit pixel (51).

Referring to FIGS. 8A~8C, the second metallization layer (L2) is patterned to include column output lines (175), voltage source (VDD) lines (179) and interconnect lines (176). The column output lines (175) are connected to the pad elements (145*b*) of the first metallization layer (L1) by via connections (165). The column output lines (175) extend in a column direction along the edges of the photodiode regions (110a, 110b) and shield those portions of the light sensitive regions adjacent the photodiodes (110a, 110b) which are not covered by the first metallization pattern (L1). The column output lines (175) include protruding dummy elements (D5) that compensate for the protrusions for contact (165) regions to thereby equalize the sensitivity. In the exemplary embodiment of FIG. 8A, the column output lines (175) are mirror image patterns with respect to the centerline C between the sub-pixel units (51a) and (51b).

For further equalization, referring to FIG. 8B, via plugs (not shown) may optionally be formed between the protruding dummy elements (D5) of output line (175) and the dummy pad elements (D1) of the first metallization pattern (L1) to compensate for the contact plug (165).

The interconnects (176) provide electrical connections between the first and second FD regions of the unit pixels (51). In particular, a contact plug (167a) is formed to connect one end of the interconnect line (167) to an end portion of the interconnect line (146a) of the first metallization layer (L1) in alignment with contact plug (137a) (FIG. 7A) In addition, a contact plug (167b) is formed to connect the other end of the interconnect line (167) to an end portion of the interconnect line (146b) of the first metal layer (L1) aligned to the contact plug (137b). In the exemplary embodiment of FIG. 8A, the interconnects (176) are mirror image patterns with respect to the centerline C between the sub-pixel units (51a) and (51b).

The voltage source lines (179) extend in a column direction along the edges of the photodiodes (110a, 110b) and shield those portions of the light sensitive regions adjacent the photodiodes (110a, 110b) which are not covered by the first metallization pattern (L1). The voltage source lines (179) have protruding portions with contact plugs (169) that connect to the contact pads (149) of the first metal layer (L1). The voltage source lines (179) have protruding dummy elements (D6) which extend over the light sensitive regions between the photodiodes (110a and (110b) to provide further shielding of the light sensitive regions not covered by the control lines (141-144) of the first metallization pattern (L1) further define the light receiving region. In the exemplary embodiment of FIG. 8A, the voltage source lines (179) have mirror image patterns with respect to the centerline C between the sub-pixel units (51a) and (51b).

Referring to FIGS. 8B and 8C, an interlayer dielectric layer (150) is formed over the substrate having the first metallization pattern (L1) using conventional methods. For instance, the dielectric layer (150) may be formed of silicon dioxide that is deposited using a CVD process. The plugs (135) (and other plugs as described above in FIG. 8A) are formed of copper or tungsten, for example, using conventional methods such as described above. The second metallization pattern (L2) can then be formed by depositing a conductive material such as copper or aluminum by sputtering and then patterning the conductive layer using a conventional photolithography process.

Figure 9:
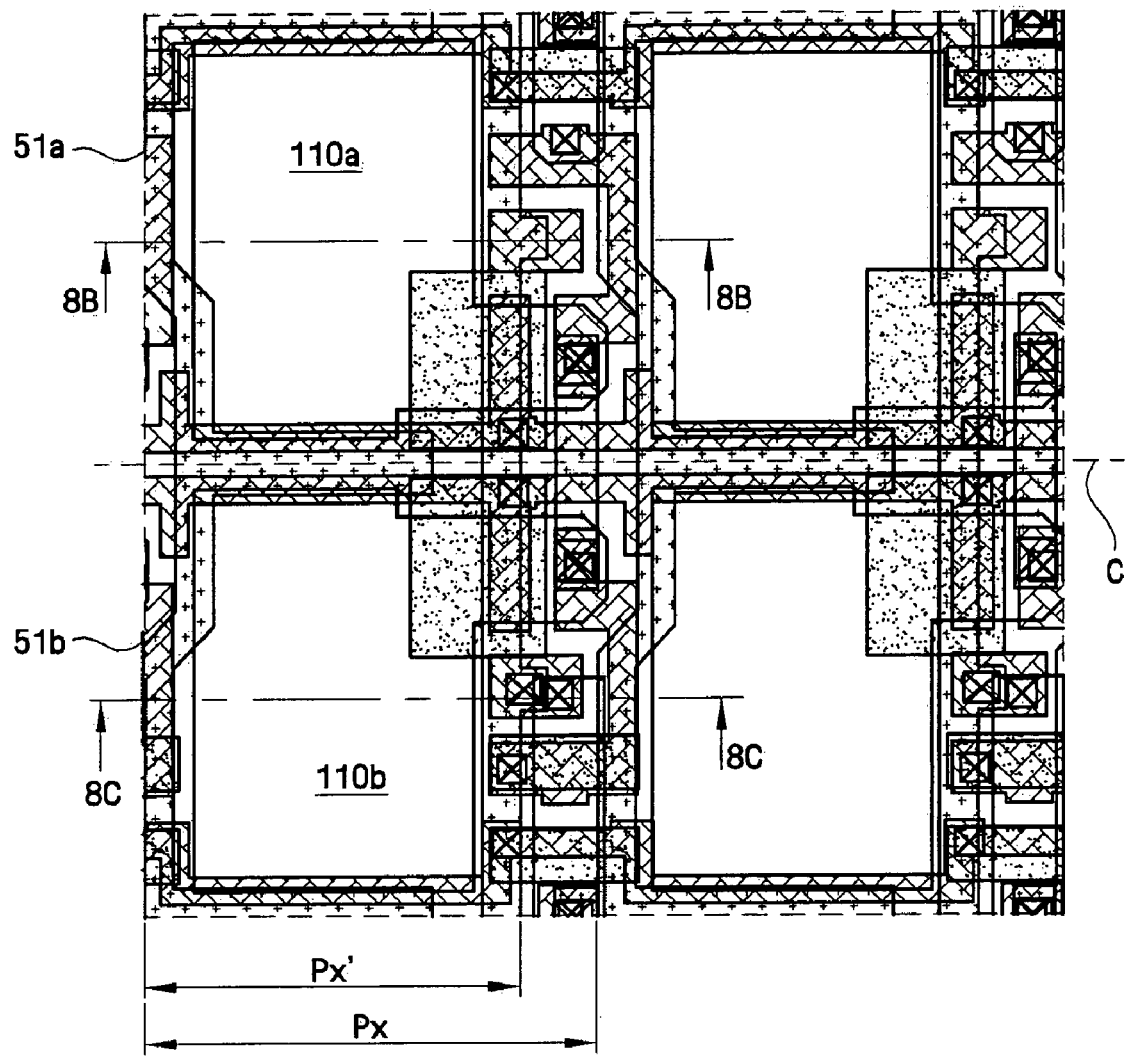
Figure 9:
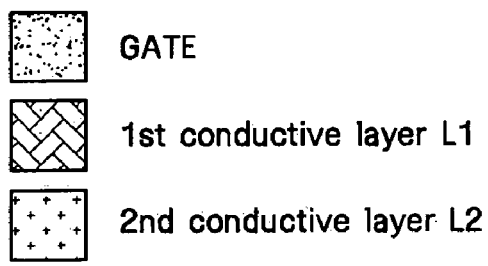

FIG. 9 is schematic top plan view illustrating the combined layout patterns of the gate electrodes and the first and second metallization layers L1 and L2. As shown, in each pixel (51) the first and second metallization layers L1 and L2 are symmetrically patterned and arranged around the photodiode regions (110a and (110b) such that the first and second layers effectively define apertures in the EPS regions, which expose light receiving regions in each pixel, wherein the light receiving regions are symmetric in size and area.

In the exemplary embodiment depicted in FIG. 9, the light receiving regions include most of the active regions A1 and a portion of the light sensitive regions surrounding the regions A1. By symmetrically patterning one or more of the lower metallization layers to operate as light shields, the exposed area of the light receiving region can be maximized to increase pixel sensitivity, while maintaining uniform pixel sensitivity for each photodiode in a give pixel and the photodiodes across the pixel array. For the exemplary shared pixel structure of FIG. 9, equalized sensitivity between photodiodes 110a and 110b in a given unit pixel (51) is obtained by forming the gate and metallization layers L1, L2 to have repeating unit patterns in each unit pixel and repeating sub unit patterns for sub-pixel units in each unit pixel. Moreover, in another exemplary embodiment, the sub unit patterns in each unit pixel for a mirror image pattern with respect to the centerline C of the unit pixel, although it is to be understood that use of a mirror image pattern is not required.

Figure 10:
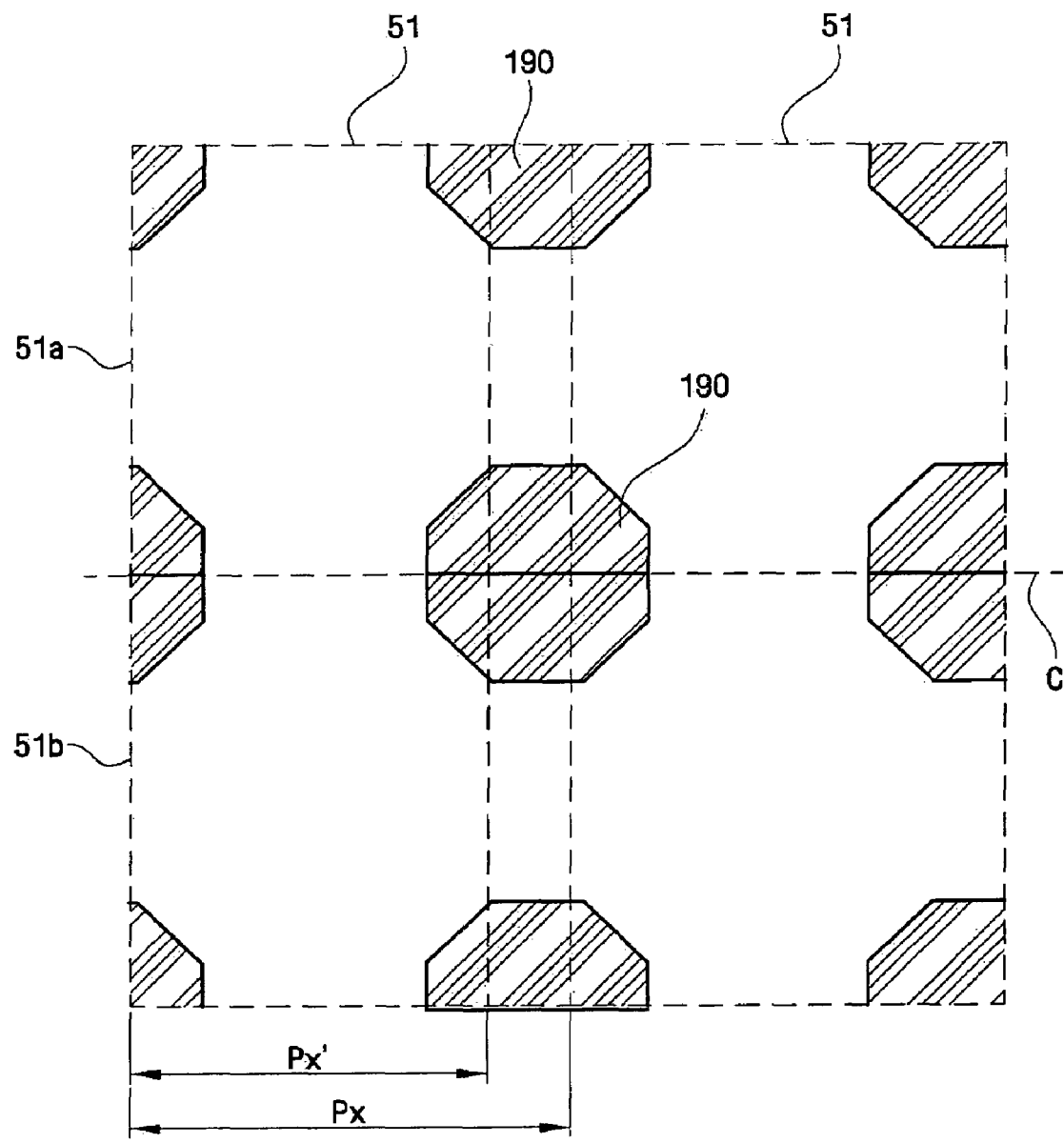

FIG. 10 is a schematic top plan view illustrating a layout pattern of a third metallization layer (L3) that can be formed over the pixel sensor array (50). The third metallization layer (L3) is patterned to form isolated pads (190) (aluminum or copper) that have no electrical function, but function to reduce a difference in a global step in the substrate, which results from a different number of conductive layers being formed in active pixel array (50) and a peripheral logic area of the solid state image sensor chip which includes circuits such as analog-to-digital converters, ISP (image signal processors), etc.

In the exemplary embodiment of FIG. 10, the third conductive patterns (190) can be symmetrically patterned and arranged over active regions A2 and regions of A1 adjacent to regions A2 in a manner that provides further light shielding of light sensitive areas not covered by the first and second metallization layers, but which avoid limiting the angle of incident light that can be captured.

Figure 11:
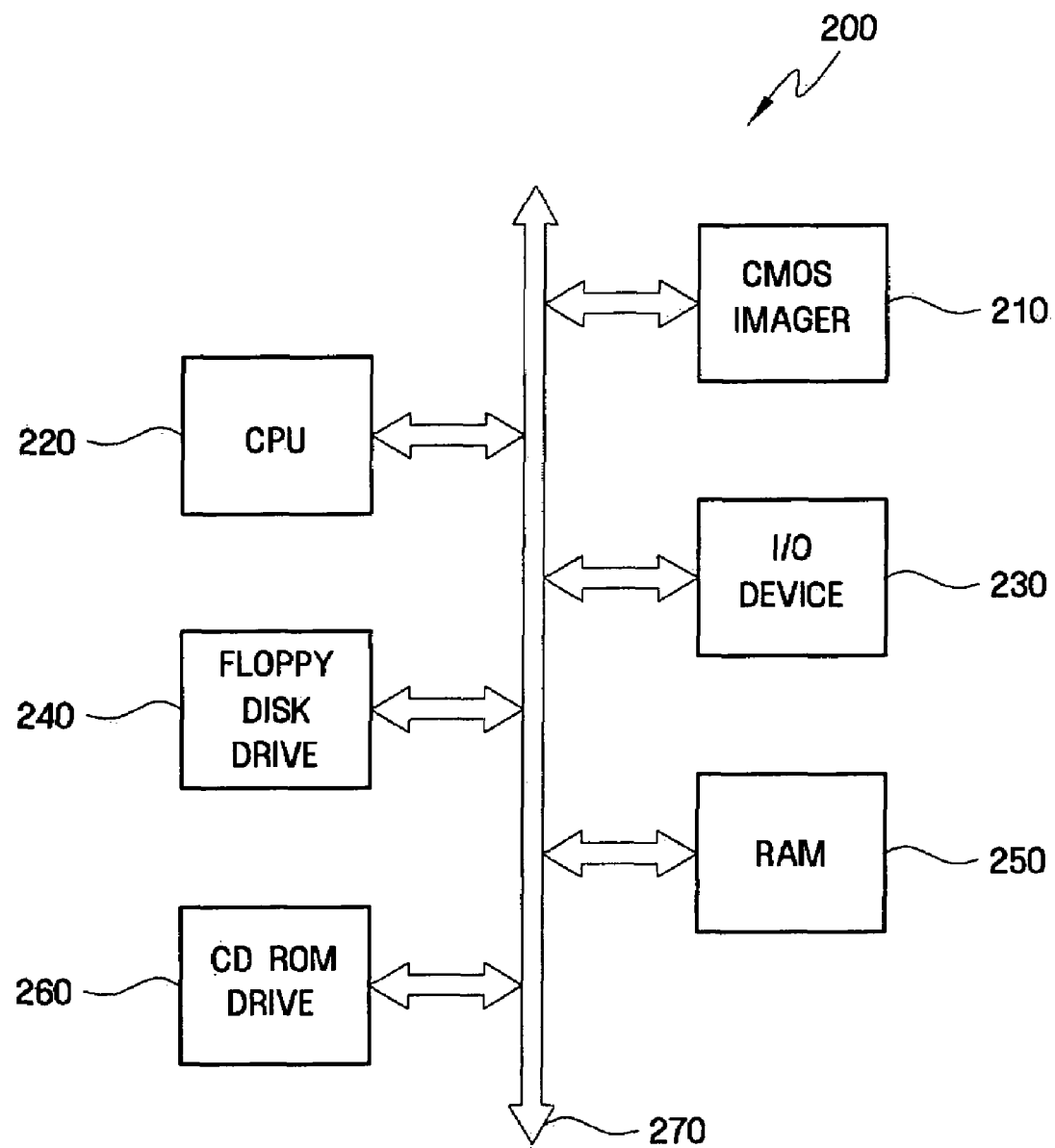
FIG. 11 is a high-level block diagram of a system having an image sensor device according to an exemplary embodiment of the invention.

It is to be further appreciated that CMOS image sensor devices having pixel arrays constructed with pixels according to exemplary embodiments of the invention may be implemented in various types of processor-based systems. For example, FIG. 11 is a high-level block diagram of a system (200) having an image sensor device according to an exemplary embodiment of the invention. The system (200) may be implemented in, for example, a computer system, camera system, scanner, machine vision system, vehicle navigation system, video phone, surveillance system, auto focus system, star tracker system, motion detection system, image stabilization system, mobile phone, and other processor-based systems.

In general, the system (200) comprises a CMOS imager device (210), one or more CPUs (central processing units) or microprocessors (220), one or more I/O devices (230), a floppy disk drive (240) (or other memory card slots), RAM (250) and a CD ROM drive (260), all of which are operatively coupled via a system bus (270). The types of system components implemented will vary depending on the type of system. For instance, the peripheral devices such as floppy disk drive (240) and CD ROM drive (260) are typically employed with personal computers or laptop computers, for example.

The CMOS imager device (210) comprises a pixel array that may be constructed using any one of the exemplary pixel architectures described herein. The CMOS imager device (210) produces an output image from signals supplied from the pixel array. The CMOS imager device (210) communicates with the system components over the bus (270) or other communication links. In other exemplary embodiments, the processor (220), CMOS imager device (210) and memory (250) may be integrally formed on a single IC chip.

Although exemplary embodiments have been described herein with reference to the accompanying drawings, it is to be understood that the invention is not limited to the exemplary embodiments described herein, and that various other changes and modifications may be readily envisioned by one of ordinary skill in the art without departing form the scope or spirit of the invention. All such changes and modifications are intended to be included within the scope of the invention as defined by the appended claims.

We claim:

1. An image sensing device, comprising:
a pixel array comprising a plurality of unit pixels formed in a semiconductor substrate, wherein each unit pixel comprises a plurality of readout elements and at least one light receiving element; and
a first wiring layer formed over the pixel array comprising a first pattern of wiring lines, wherein the first pattern of wiring lines comprises electrical interconnections between readout elements in the unit pixels,
wherein the first wiring layer is an optical blocking layer to block incident light in each unit pixel to maintain substantially the same sensitivity for each light receiving element of the pixel array,
wherein each unit pixel is a shared unit pixel comprising a first sub-pixel unit and a second sub-pixel unit, wherein the first pattern of wiring lines comprises a first unit pattern that is repeated in each unit pixel in the pixel array, and
wherein the first unit pattern comprises a sub-unit pattern that is repeated in each sub-pixel unit of each unit pixel in the pixel array, wherein the sub-unit pattern comprises a pad element, wherein the pad element is as an isolated dummy pad element for the first sub-pixel unit.

2. The image sensing device of claim 1, further comprising, a second wiring layer formed over the first wiring layer comprising a second pattern of wiring lines, wherein the second pattern of wiring lines comprises voltage supply lines,
wherein the second wiring layer is a second optical blocking layer to block incident light in each unit pixel to maintain substantially the same sensitivity for each light receiving element of the pixel array.

3. The image sensing device of claim 2, wherein the second pattern of wiring lines comprise a second unit pattern that is repeated in each unit pixel in the pixel array.

4. The image sensing device of claim 3, wherein the first and second unit patterns for each unit pixel are arranged to define an aperture of similar size and shape in each unit pixel to expose a light receiving region of each unit pixel, wherein the light receiving region of each unit pixel includes an active region that includes the light receiving element of the unit pixel.

5. The image sensing device of claim 4, wherein the light receiving region of each pixel includes at least a portion of a non-active region adjacent the active region including the light receiving element.

6. The image sensing device of claim 2, wherein the second pattern of wiring lines comprise pixel I/O lines having dummy protruding elements.

7. The image sensing device of claim 2, wherein the voltage supply lines comprise dummy protruding elements.

8. The image sensing device of claim 1, wherein the first pattern of wiring lines comprise pixel control lines having dummy protruding elements.

9. The image sensing device of claim 1, wherein the unit pixels comprise a shared light receiving element framework.

10. The image sensing device of claim 1, wherein the pad element is an electrical contact pad for the second sub-pixel unit that is connected to a readout element of the second sub-pixel unit.

11. The image sensing device of claim 1, wherein the sub-unit patterns of the first and second sub-pixel units form a mirror image pattern.

12. An image sensing device, comprising:
a pixel array comprising a plurality of unit pixels formed in a semiconductor substrate, wherein each unit pixel comprises a plurality of readout elements and a light receiving element; and
a first optical blocking layer formed over the pixel array to maintain substantially the same sensitivity for each light receiving element of the pixel array, wherein the first optical blocking layer comprises a wiring pattern to connect readout elements, and a dummy pattern, wherein the dummy pattern comprises electrically isolated dummy elements.

13. The image sensing device of claim 12, wherein the wiring and dummy pattern have unit patterns that are repeated in each unit pixel.

14. The image sensing device of claim 12, wherein the dummy pattern further comprises dummy elements that are connected to the wiring pattern.

15. The image sensing device of claim 12, wherein the dummy pattern is aligned over an isolation region of the pixel array.

16. The image sensing device of claim 12, further comprising a second optical blocking layer formed over the first optical blocking layer to maintain substantially the same sensitivity for each light receiving element of the pixel array, wherein the second optical blocking layer comprises a wiring pattern including voltage supply lines.

17. An image sensing device, comprising:
a pixel array comprising a plurality of unit pixels formed in a semiconductor substrate, wherein each unit pixel has a same layout pattern, wherein said layout pattern comprises a light receiving element region, a plurality of readout element regions, and an isolation region surrounding the light receiving element and readout element regions,
a first metallization layer formed over the pixel array, wherein the first metallization layer comprises metal lines that form interconnections between readout element regions in the pixel array;
wherein the first metallization layer comprises a first unit pattern that is repeated in each unit pixel in the pixel array, wherein the first unit pattern is an optical blocking layer in each unit pixel which is disposed over the same areas of the isolation region surrounding the light receiving element region of each unit pixel, and
wherein each unit pixel is a shared unit pixel comprising a first sub-pixel unit and a second sub-pixel unit, wherein the first unit pattern is formed of a sub-unit pattern that are repeated in each sub-pixel unit of each unit pixel in the pixel array, wherein the sub-unit pattern comprises a pad element, wherein the pad element is as an isolated dummy pad element for the first sub-pixel unit.

18. The image sensing device of claim 17, wherein the first unit pattern includes a dummy metal line.

19. The image sensing device of claim 17, further comprising a second metallization layer formed over the first metallization layer, wherein the second metallization layer comprises metal lines that form I/O lines for the unit pixels, and wherein the second metallization layer comprises a second unit pattern that is repeated in each unit pixel in the pixel array, wherein the second unit pattern is an optical blocking layer that is disposed over the same areas of the isolation region surrounding the light receiving element region of each unit pixel.

20. The image sensing device of claim 19, wherein the second unit pattern comprises a dummy metal line.

21. The image sensing device of claim 19, wherein second unit pattern comprises a mirror image pattern.

22. The image sensing device of claim 19, wherein the first and second unit patterns for each unit pixel are arranged to define an aperture of similar size and shape in each unit pixel to expose a light receiving region of each unit pixel, wherein the light receiving region of each unit pixel includes an active region that includes the light receiving element of the unit pixel, and wherein the light receiving area of each pixel includes at least a portion of the isolation region surrounding the light receiving element region.

23. The image sensing device of claim 17, wherein the pad element is an electrical contact pad for the second sub-pixel unit that is connected to a readout element of the second sub-pixel unit, and wherein each first sub-pixel unit comprises a dummy contact plug connected to the isolated dummy pad element, wherein the dummy contact plug corresponds to a contact plug connecting the pad element to the readout element of the second sub-pixel unit.

* * * * *